US009267986B2

(12) United States Patent
Hashimoto et al.

(10) Patent No.: US 9,267,986 B2
(45) Date of Patent: Feb. 23, 2016

(54) THREE-DIMENSIONAL INTEGRATED CIRCUIT AND TESTING METHOD FOR THE SAME

(71) Applicant: Panasonic Intellectual Property Management Co., Ltd., Osaka (JP)

(72) Inventors: Takashi Hashimoto, Hyogo (JP); Takashi Morimoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/806,059

(22) Filed: Jul. 22, 2015

(65) Prior Publication Data

US 2015/0323591 A1  Nov. 12, 2015

Related U.S. Application Data

(62) Division of application No. 13/642,673, filed as application No. PCT/JP2012/003651 on Jun. 4, 2012, now Pat. No. 9,121,894.

(30) Foreign Application Priority Data

Jun. 9, 2011 (JP) ................................ 2011-128885

(51) Int. Cl.
*H01L 21/66* (2006.01)
*G01R 31/26* (2014.01)
*G01R 31/28* (2006.01)

(52) U.S. Cl.
CPC ........ *G01R 31/2887* (2013.01); *G01R 31/2853* (2013.01); *G01R 31/2889* (2013.01); *H01L 22/14* (2013.01)

(58) Field of Classification Search
None
See application file for complete search history.

(56) References Cited

U.S. PATENT DOCUMENTS 5,383,269 A    1/1995  Rathmell et al.
6,310,303 B1 * 10/2001  Luvara ................ H01L 23/5386
                                                           174/261

(Continued)

FOREIGN PATENT DOCUMENTS

CN    1349660 A    5/2002
CN    1188911 C    2/2005

(Continued)

OTHER PUBLICATIONS

International Search Report issued Jun. 26, 2012 in corresponding International Application No. PCT/JP2012/003651.

(Continued)

*Primary Examiner* — Seahvosh Nikmanesh
(74) *Attorney, Agent, or Firm* — Wenderoth, Lind & Ponack, L.L.P.

(57) ABSTRACT

Each chip in a three-dimensional circuit includes a pair of connections, a test signal generation circuit, and a test result judgment circuit. The connections are electrically connected with an adjacent chip. The test signal generation circuit outputs a test signal to one of the connections. The test result judgment circuit receives a signal from the other of the connections and, from the state of the signal, detects the conducting state of the transmission path for the signal. Before layering the chips, a conductor connects the connections to form a series connection, and the conducting state of each connection is detected from the conducting state of the series connection. After layering the chips, the test signal generation circuit in one chip outputs a test signal, and the test result judgment circuit in another chip receives the test signal, and thus the conducting state of the connections between the chips is tested.

4 Claims, 20 Drawing Sheets

(56) References Cited

U.S. PATENT DOCUMENTS

| | | |
|---|---|---|
| 8,866,488 B2 | 10/2014 | Wang et al. |
| 2003/0008432 A1 | 1/2003 | Kux et al. |
| 2006/0001176 A1 | 1/2006 | Fukaishi et al. |
| 2007/0023121 A1 | 2/2007 | Jones et al. |
| 2009/0102503 A1 | 4/2009 | Saito |
| 2009/0224784 A1 | 9/2009 | Pagani |
| 2011/0057819 A1 | 3/2011 | Ide et al. |
| 2011/0309359 A1 | 12/2011 | Saen et al. |
| 2013/0024737 A1 | 1/2013 | Marinissen et al. |
| 2013/0214761 A1 | 8/2013 | Chang et al. |

FOREIGN PATENT DOCUMENTS

| | | |
|---|---|---|
| CN | 101258583 A | 9/2008 |
| JP | 2002-543621 | 12/2002 |
| JP | 2004-281633 | 10/2004 |
| JP | 2006-019328 | 1/2006 |
| JP | 2009-288040 | 12/2009 |
| JP | 2011-081882 | 4/2011 |
| WO | 2007/032184 | 3/2007 |
| WO | 2010/097947 | 9/2010 |

OTHER PUBLICATIONS

Erik Jan Marinissen, "Testing TSV-Based Three-Dimensional Stacked ICs", Proceedings IEE Design, Automation & Test in Europe Conference & Exhibition (DATE) 2010, Mar. 2010, pp. 1689-1694.

Office Action issued Feb. 17, 2015 in corresponding Chinese Patent Application No. 201280001180.4 (with English translation of Search Report).

* cited by examiner

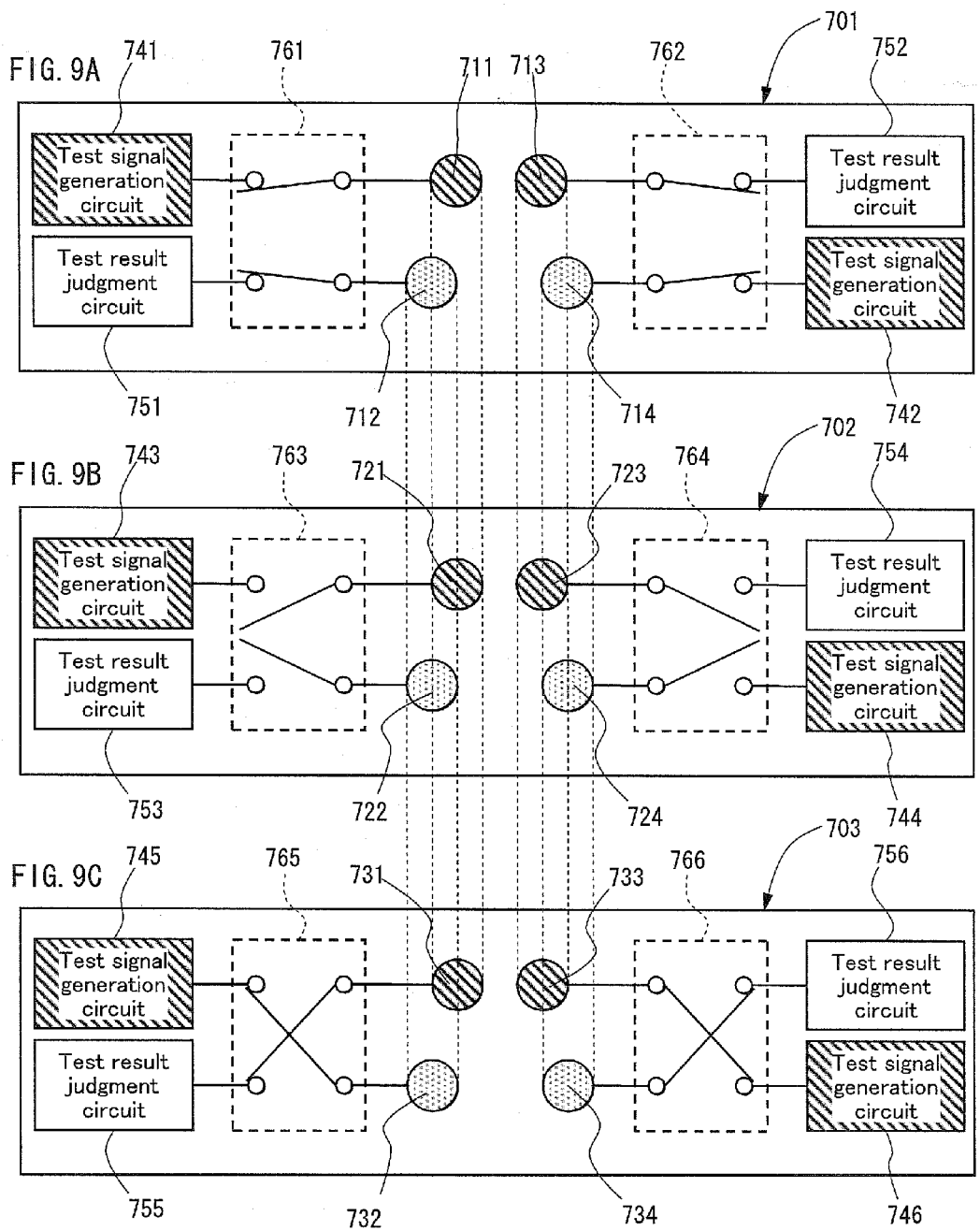

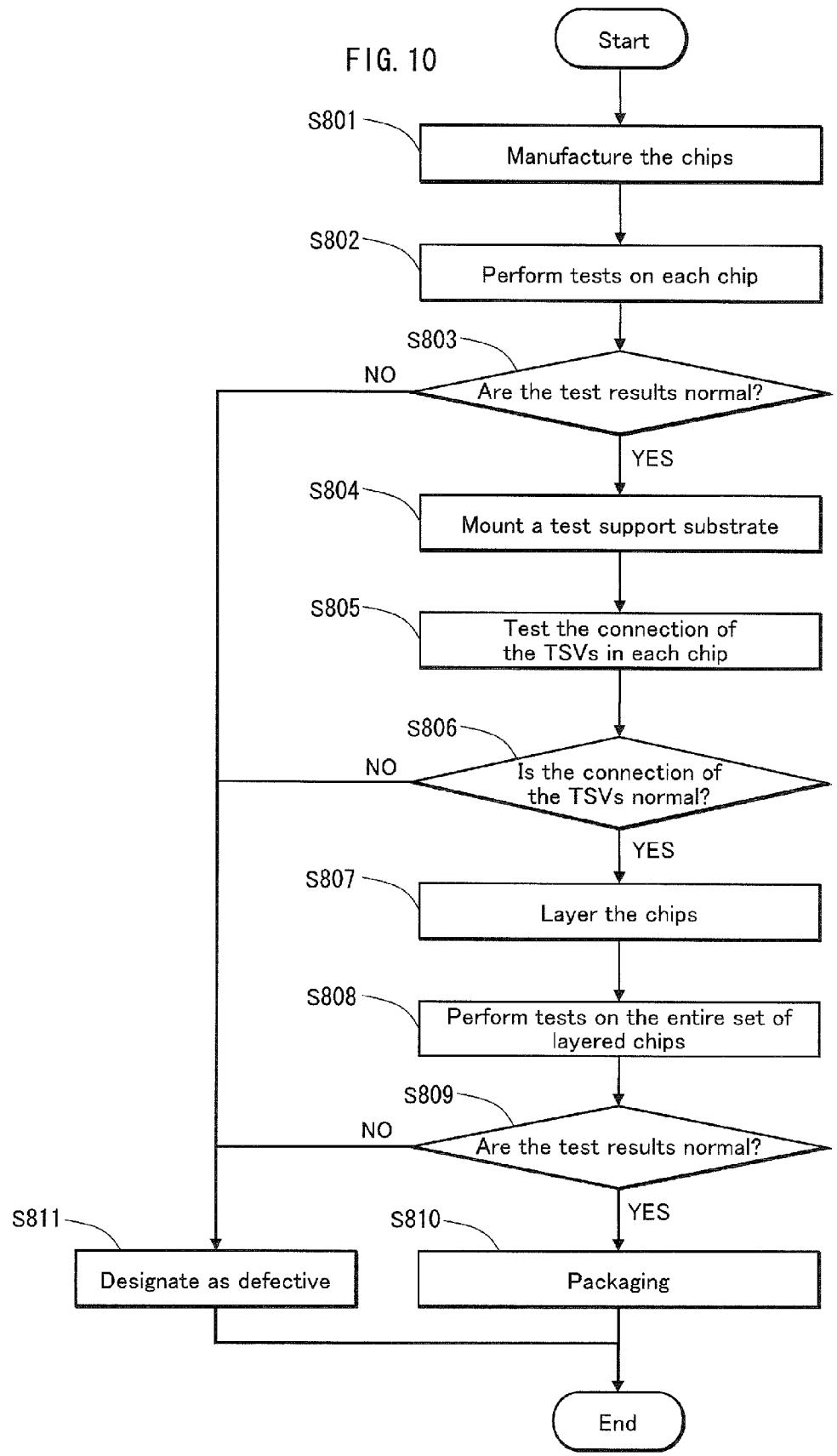

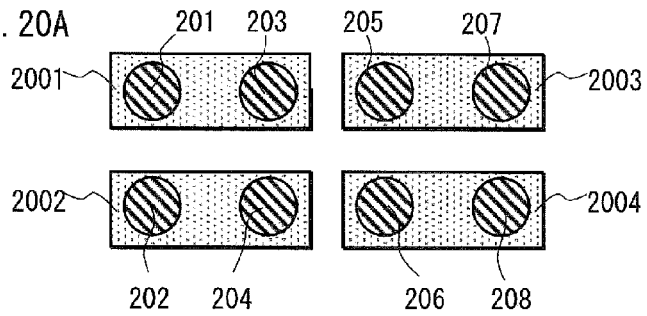
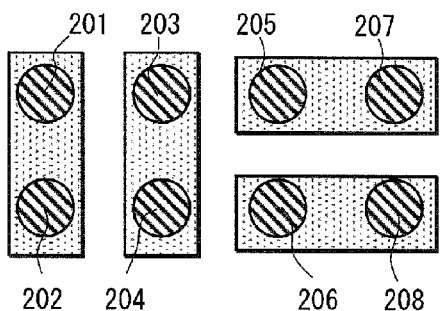
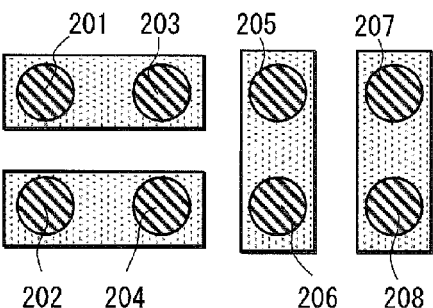
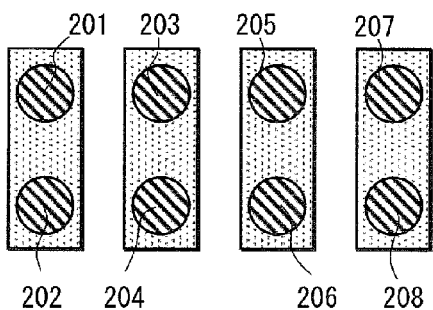
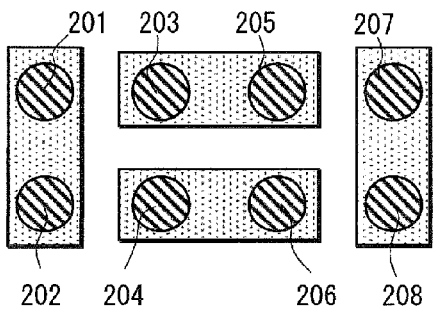

THREE-DIMENSIONAL INTEGRATED CIRCUIT AND TESTING METHOD FOR THE SAME

TECHNICAL FIELD

The present invention relates to three-dimensional layering technology, and in particular to technology for testing connections between circuits.

BACKGROUND ART

The demand exists for further improvement in the degree of integration of semiconductor integrated circuits. However, reducing the size of semiconductors has almost reached a limit. Therefore, technology for layering a plurality of chips, i.e. three-dimensional layering technology, is being developed.

Three-dimensional layering technology mainly uses a TSV (Through Silicon Via) as wiring and a terminal to connect chips, i.e. as a connection between chips. A TSV is formed by etching a through-hole in a silicon substrate and filling the hole with conductive material such as copper. Typically, the diameter of a TSV is between several μm and several dozen μm, whereas the depth of a TSV is several hundred μm. Forming a large number of TSVs on a chip raises the density of the TSVs, making TSVs with a high aspect ratio (height/diameter) necessary. As the aspect ratio increases, it becomes more difficult to fill the TSV, and the occurrence of cavities referred to as "voids" becomes more common. A void degrades the conducting state of a TSV, hampering inter-chip connection through the TSV. Furthermore, since TSVs are a fine structure, it is difficult to accurately align TSVs when layering two chips. Accordingly, in order to confirm a proper connection through a TSV between layered chips, three-dimensional layering technology also requires technology for testing both the conducting state of a TSV itself and the TSV-chip conducting state. Additionally, to maintain a high yield of integrated circuits manufactured using three-dimensional layering technology (hereinafter referred to as "three-dimensional integrated circuits"), it is necessary to test the circuits implemented on each chip before layering a plurality of chips. Therefore, in order to improve the yield upon manufacturing three-dimensional integrated circuits, it is effective to perform a test on each chip before layering a plurality of chips (Pre-Bonding Test). After layering a plurality of chips, a test is performed on the plurality of layered chips (Post-Bonding Test), and at this point it is effective to perform both a test on each chip as well as a test on the TSVs connecting chips. As compared to tests for a single layer integrated circuit, tests for three-dimensional integrated circuits are therefore complex. As a result, in order to reduce the cost of manufacturing three-dimensional integrated circuits, it is necessary to improve the efficiency of these two types of tests and to reduce the number of steps involved.

DFT (Design for Testability) is a known technology for improving the efficiency of tests performed when manufacturing integrated circuits. DFT is technology that aims to make a test for an integrated circuit easy by incorporating a circuit necessary to perform the test into the integrated circuit in the design phase. The technology disclosed in Non-Patent Literature 1 is an example of DFT that targets three-dimensional integrated circuits. This technology is an extension of the standard DFT in IEEE 1149.1/4/6 to three-dimensional integrated circuits. Specifically, a test circuit, such as a TAM (Test Access Mechanism), a scan chain, a TDC (Test Data Compression), or a BIST (Built-In Self-Test), for testing circuits implemented on a chip is incorporated into each chip. A dedicated testing pad is also provided in each chip for accessing to the test circuit from an external source. Each chip is also provided with a dedicated terminal for receiving a test signal from another chip which lies below the level of the chip, and with a switch for selectively connecting the test circuit either the dedicated terminal or the dedicated testing pad. When several tests are performed on each chip before a plurality of chips is layered, the switch in each chip connects the test circuit with the dedicated testing pad. As a result, the external test signal is sent through the dedicated testing pad to the test circuit of each chip. On the other hand, when tests are performed on the layered chips after a plurality of chips is layered, the switch connects the test circuit in each chip to the dedicated terminal. As a result, a test signal is sent from the bottom substrate through the dedicated terminal between chips to the test circuit of each chip.

The three-dimensional integrated circuit disclosed in Patent Literature 1 is also known. In this three-dimensional integrated circuit, each chip is provided with a mounting terminal and a testing terminal. Each terminal is a TSV. The mounting terminal is connected to a circuit implemented on the chip. The testing terminal is separated from a circuit implemented on the chip. Upon layering a plurality of chips, the testing terminals of the chips form a transmission path for a testing signal. When a new chip is further layered on top of this group of chips, the mounting terminal of the new chip is connected to the testing terminals of the group of chips, and a test signal is sent to the new chip through the testing terminals. In this way, the circuits implemented on the new chip and the mounting terminal can be tested. If the test results indicate no defects in the circuits and the mounting terminal, the mounting terminal of the new chip is reconnected to the mounting terminals of the group of chips. It is thus possible to layer only chips without any defects.

Patent Literature 2 discloses the following integrated circuit. Two chips in the integrated circuit are connected to each other through a plurality of connection terminals by wire bonding. A test output control circuit is implemented on one of the chips, and an expected value judgment circuit is implemented on the other chip. The test output control circuit outputs test data to the plurality of connection terminals. The test data is set so that the logical level is flipped between two adjacent connection terminals. The expected value judgment circuit receives the test data from the plurality of connection terminals and judges whether each piece of received test data matches the test data output by the test output control circuit. The judgment results indicate not only whether any of the connection terminals is disconnected, but also whether any pair of adjacent connection terminals has short-circuited.

CITATION LIST

Patent Literature

Patent Literature 1: Japanese Patent Application Publication No. 2004-281633
Patent Literature 2: Japanese Patent Application Publication No. 2009-288040

Non-Patent Literature

Non-Patent Literature 1: Erik Jan Marisissen, "Testing TSV-Based Three-Dimensional Stacked ICs," Proceedings IEEE Design, Automation & Test In Europe Conference & Exhibition (DATE) 2010, March 2010, pp. 1689-1694

SUMMARY OF INVENTION

Technical Problem

The technology listed in Non-Patent Literature 1 is for series transmission of a test signal from the bottom to the top of a plurality of layered chips. Accordingly, as the number of layered chips increases, it becomes difficult to shorten the test time. Furthermore, a different test circuit is used for testing before and after layering the plurality of chips. This makes it difficult to reduce the overall area of the test circuits incorporated into the chips. Patent Literature 1 does not disclose a method for testing the connection of mounting terminals after layering of the plurality of chips. By contrast, Patent Literature 2 does not disclose a method for testing the connection terminals before layering of the plurality of chips. For a DFT that targets three-dimensional integrated circuits, method that can efficiently test the terminals connecting the chips both before and after layering of a plurality of chips is unknown.

The present invention has been conceived in light of the above problems, and is an object thereof to provide a three-dimensional integrated circuit that can efficiently test the terminals connecting the chips both before and after layering of a plurality of chips.

Solution to Problem

In a three-dimensional integrated circuit according to one aspect of the present invention, a plurality of chips is layered. Each of the plurality of chips is provided with a pair of connections, a test signal generation circuit and a test result judgment circuit. The pair of connections is electrically connected with an adjacent chip among the plurality of chips. The test signal generation circuit outputs a test signal to one of the pair of connections. The test result judgment circuit receives a signal from the other of the pair of connections, and detects the conducting state of the transmission path for the signal in accordance with the state of the signal.

A test method for a three-dimensional integrated circuit according to an aspect of the present invention comprises the following steps. First, a first connection and a second connection formed in a first chip are connected with a conductor to form a series connection of the first connection and the second connection. Next, a first test signal is transmitted from a first test signal generation circuit formed in the first chip to one end of the series connection, the first test signal is received from the other end of the series connection by a first test result judgment circuit formed in the first chip, and the conducting state of the series connection is detected in accordance with the state of the first test signal. The conductor is then removed from the series connection, the first chip is layered on the second chip, and the first chip is electrically connected to the second chip through the first connection and the second connection. Furthermore, a second test signal is transmitted from the first test signal generation circuit to the first connection, the second test signal is received from the first connection by a second test result judgment circuit formed in the second chip, and the conducting state between the first connection and the second chip is detected in accordance with the state of the second test signal. A third test signal is then transmitted from the second test signal generation circuit formed in the second chip to the second connection, the third test signal is received from the second connection by the first test result judgment circuit, and the conducting state between the second connection and the second chip is detected in accordance with the state of the third test signal.

Advantageous Effects of Invention

In the three-dimensional integrated circuit according to the above aspect of the present invention, one of the pair of connections provided in each chip is connected to the test signal generation circuit, and the other is connected to the test result judgment circuit. Therefore, before layering the chips, a series connection is formed by connecting the pair of connections with the conductor, and the conducting state of each of the connections is detected based on the conducting state of the series connection. After layering the chips, the test signal generation circuit in one chip outputs a test signal, and the test result judgment circuit in another chip receives the test signal, and thus the conducting state of the connections between chips is tested. In this way, both before and after layering a plurality of chips, the conducting state of the connections between a plurality of chips can be tested efficiently.

BRIEF DESCRIPTION OF DRAWINGS

FIG. 6A schematically illustrates conditions when two horizontally adjacent TSVs are connected by a testing wire, and FIG. 6B schematically illustrates conditions when two vertically adjacent TSVs are connected by a testing wire;

FIG. 8A is a block diagram of four TSVs and their surrounding circuits in the upper chip 601, and FIG. 8B is a block diagram of four TSVs and their surrounding circuits in the lower chip 602;

FIGS. 9A, 9B, and 9C are schematic diagrams illustrating conditions during the second connection test with chips 701, 702, and 703 layered; FIG. 9A is a block diagram of four TSVs and their surrounding circuits in the uppermost chip 701, FIG. 9B is a block diagram of four TSVs and their surrounding circuits in the middle chip 702, and FIG. 9C is a block diagram of four TSVs and their surrounding circuits in the lowermost chip 703;

FIG. 10 is a flowchart of a method of manufacturing three-dimensional integrated circuits according to Embodiment 1 of the present invention;

FIG. 14A is a block diagram of four TSVs and their surrounding circuits in the upper chip 901, and FIG. 14B is a block diagram of four TSVs and their surrounding circuits in the lower chip 902;

FIGS. 20A, 20B, 20C, 20D, and 20E are schematic diagrams illustrating conditions when performing the first connection test on the eight TSVs 201-208 illustrated in FIG. 19, respectively illustrating connection of the eight TSVs in a first pattern, a second pattern, a third pattern, a fourth pattern, and a fifth pattern.

DESCRIPTION OF EMBODIMENTS

The following describes embodiments of the present invention with reference to the drawings.

Embodiment 1

Figure 1:
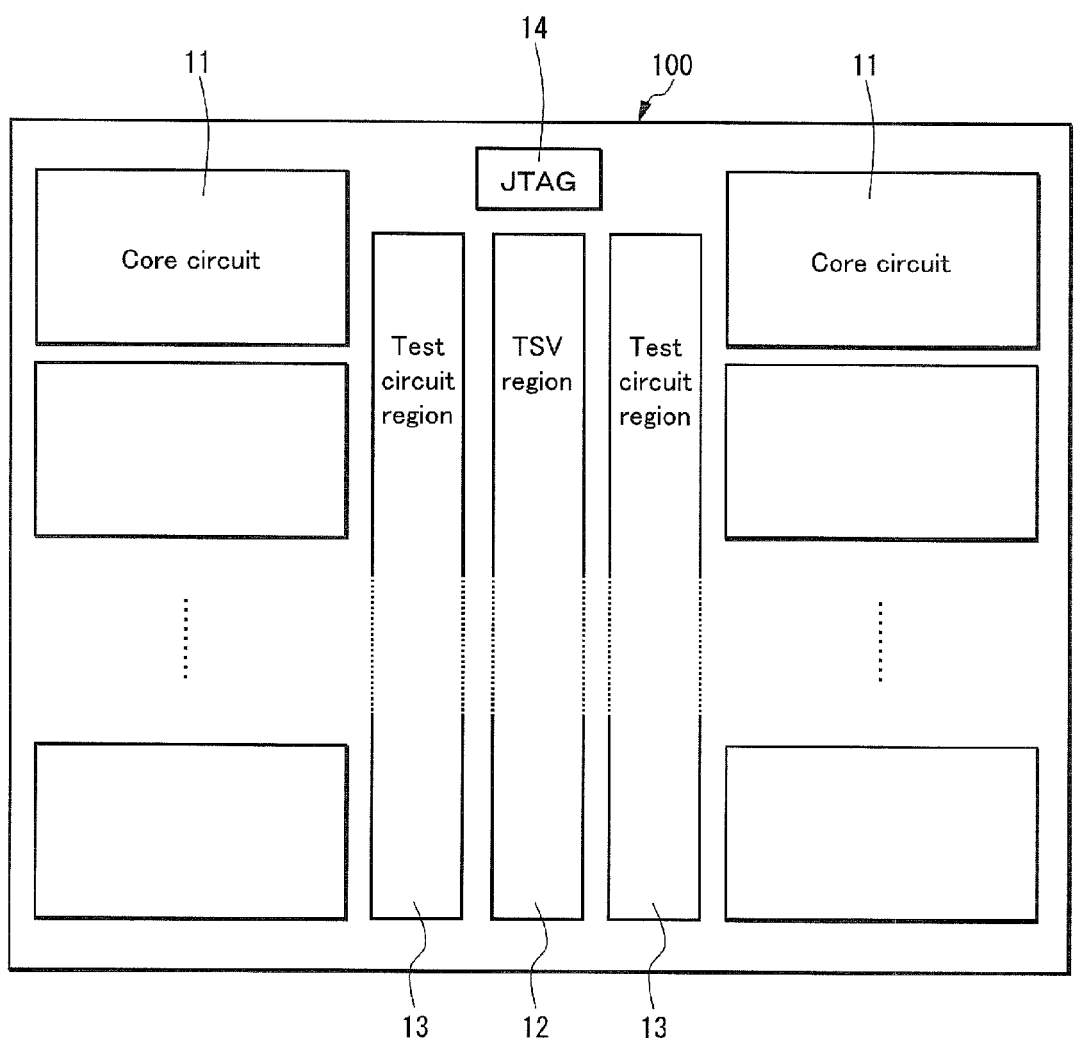
FIG. 1 is a schematic diagram illustrating the planar structure of a chip 100 according to Embodiment 1 of the present invention.

FIG. 1 is a schematic diagram illustrating the planar structure of a chip 100 according to Embodiment 1 of the present invention. As illustrated in FIG. 1, the chip 100 includes a plurality of core circuits 11, a TSV region 12, a pair of test circuit regions 13, and a JTAG (Joint Test Action Group) interface 14. The components 11, 12, 13, and 14 are covered by interconnection layers, not shown in FIG. 1, that interconnects these components. The core circuits 11 achieve the functions of a CPU, memory array, DSP (Digital Signal Processor), PLD (Programmable Logic Device), random logic circuit, and the like. The TSV region 12 is a region in which a plurality of TSVs is located in a grid. Each TSV is connected to one of the core circuits 11. When this chip 100 is layered on top of another chip, the core circuits 11 are electrically connected to the other chip through the TSVs. The test circuit regions 13 are located along either side of the TSV region 12 and include a plurality of test signal generation circuits, test result judgment circuits, and switch circuits. These circuits are used for detection of the conducting state of each TSV. The JTAG interface 14 conforms to IEEE 1149.1/4/6 and relays serial data between a DFT test circuit, such as a BIST (Built-In Self Test) circuit, and a device external to the chip 100. Through the JTAG interface 14, a functional test and a timing test of each of the core circuits 11 can be performed. Furthermore, the JTAG interface 14 allows an external device to instruct the test signal generation circuits in the test circuit regions 13 to generate test signals, to set the switch circuits in the test circuit regions 13, and to read information on the conducting state of each TSV from the test result judgment circuits in the test circuit regions 13.

Figure 2:
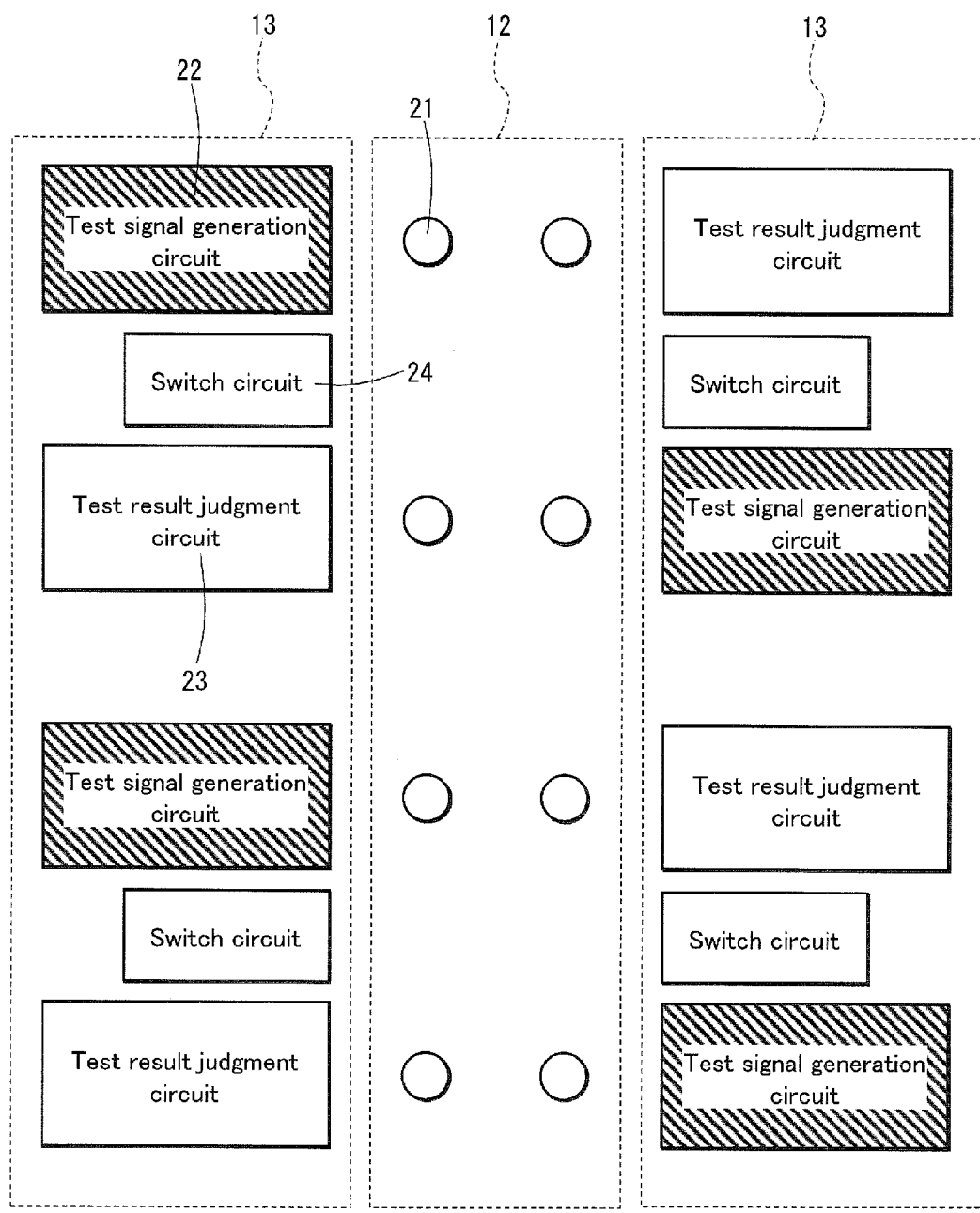
FIG. 2 is a schematic diagram illustrating the planar structure of the TSV region 12 and the test circuit regions 13 illustrated in FIG. 1.

FIG. 2 is a schematic diagram illustrating the planar structure of the TSV region 12 and the test circuit regions 13 illustrated in FIG. 1. As illustrated in FIG. 2, a plurality of TSVs 21 is placed in two rows in the TSV region 12. The diameter of each TSV 21 is several micrometers. The interval between each TSV 21 is several dozen micrometers. In each of the test circuit regions 13, sets of a test signal generation circuit 22, a test result judgment circuit 23 and a switch circuit 24 are located adjacent to a pair of TSVs 21. The switch circuit 24 receives an instruction from an external device through the JTAG interface 14 and, in response to the instruction, connects one of the pair of TSVs 21 to the test signal generation circuit 22 and connects the other to the test result judgment circuit 23.

Figure 3:
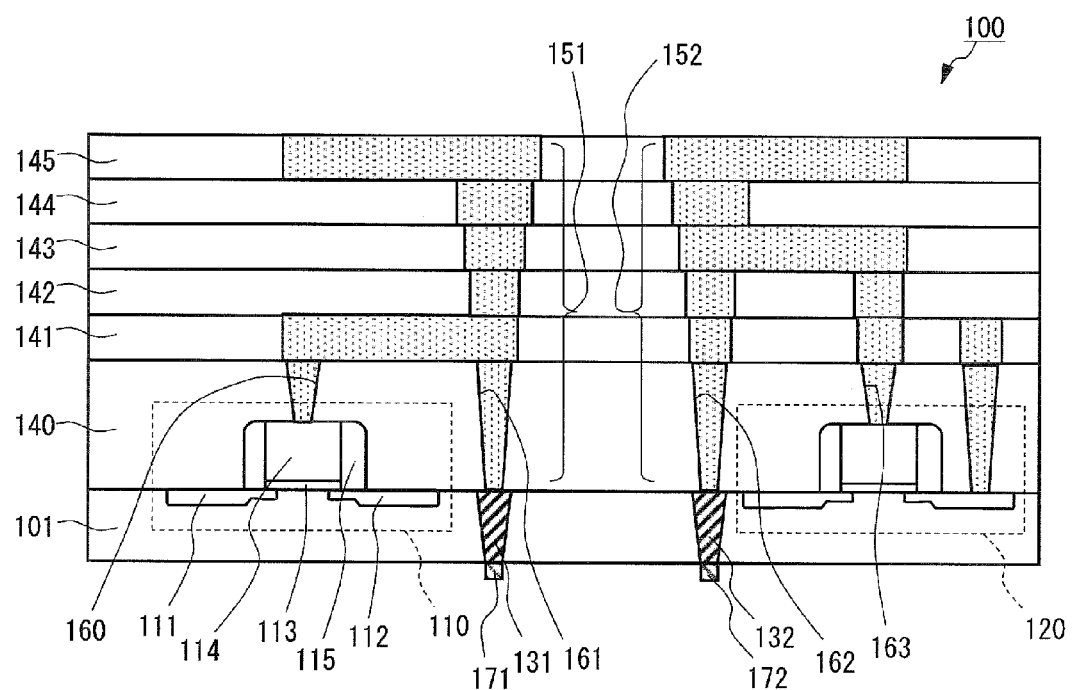
FIG. 3 is a schematic diagram illustrating a cross-section of the chip 100 illustrated in FIG. 2, the cross section showing the vicinity of the TSV region 12.

FIG. 3 is a schematic diagram illustrating a cross-section of the chip 100 near the TSV region. As illustrated in FIG. 3, this cross-section includes a substrate 101, a first transistor 110, a second transistor 120, a first TSV 131, a second TSV 132, a first interlayer insulator 140 through a sixth interlayer insulator 145, a first interconnection 151, a second interconnection 152, a first microbump 171, and a second microbump 172. The substrate 101 is formed from silicon. The transistors 110 and 120 are MOS (Metal Oxide Semiconductor) transistors. The transistors 110 and 120 are formed on the substrate 101 and include a first diffusion region 111, a second diffusion region 112, a gate oxide film 113, a gate electrode 114, and side walls 115. The first diffusion region 111 and the second diffusion region 112 are regions doped with impurity ions in the substrate 101. One of these regions is used as a drain, and the other is used as a source. When the transistor 110 is an N-type transistor, the diffusion regions 111 and 112 are doped with a donor impurity such as phosphor, whereas when the transistor 110 is a P-type transistor, the diffusion regions 111 and 112 are doped with an acceptor impurity such as boron. A gap is provided between the two diffusion regions 111 and 112 and is covered by the gate oxide film 113. The gate oxide film 113 is formed from silicon oxide ($SiO_2$) or from high-dielectric constant (High-k) material. The gate electrode 114 is formed on top of the gate oxide film 113 and is electrically isolated from the diffusion regions 111 and 112 by the gate oxide film 113. The gate electrode 114 is formed from polysilicon or metallic material. The side walls 115 cover the gate oxide film 113 and the sides of the gate electrode 114 and in particular electrically isolate the gate electrode 114 from the diffusion regions 111 and 112. The side walls 115 are formed from silicon nitride ($Si_3N_4$). The TSVs 131 and 132 have a structure including a hole that penetrates through the substrate 101 and is filled with conductive material. Polysilicon, copper, tungsten, aluminum, or nickel is used as the conductive material. The first interlayer insulator 140 covers the surface of the substrate 101, the transistors 110 and 112, and the TSVs 131 and 132. The second interlayer insulator 141 through the sixth interlayer insulator 145 are layered in order on top of the first interlayer insulator 140. Each of the interlayer insulators 140-145 is formed from silicon oxide or from low-dielectric constant (Low-k) material. An aluminum or copper pattern is formed in each of the second interlayer insulator 141 through the sixth interlayer insulator 145, and together the patterns form the interconnections 151 and 152. In the first interlayer insulator 140, a first contact hole 160 through fourth contact hole 163 are formed. The first contact hole 160 exposes the gate electrode 114 of the first transistor 110. The second contact hole 161 exposes an end of the first TSV 131. The third contact hole 162 exposes an end of the second TSV 132. The fourth contact hole 163 exposes the gate electrode of the second transistor 120. The first interconnection 151 passes through the first contact hole 161 to connect with the gate electrode 114 of the first transistor 110 and passes through the second contact hole 161 to connect with the first TSV 131. The second interconnection 152 passes through the third contact hole 162 to connect with the second TSV 132 and passes through the fourth contact hole 163 to connect with the gate electrode of the second transistor 120. The first and second interconnections, 151 and 152, are isolated from each other, and therefore the first and the second TSVs, 131 and 132, are isolated from each other. A plurality of transistors, the same as the transistors 110 and 120, are combined to form the core circuits 11 illustrated in FIG. 1 and the test signal generation circuit 22, the test result judgment circuit 23, and the switch circuit 24 illustrated in FIG. 2. While the transistors 110 and 120 are implemented on one surface of the substrate 101, the microbumps 171 and 172 are implemented on the opposite surface of the substrate 101; the microbumps 171 and 172 are formed from copper or aluminum. The first microbump 171 is connected to the tip of the first TSV 131, and the second microbump 172 is connected to the tip of the second TSV 132.

Figure 4:
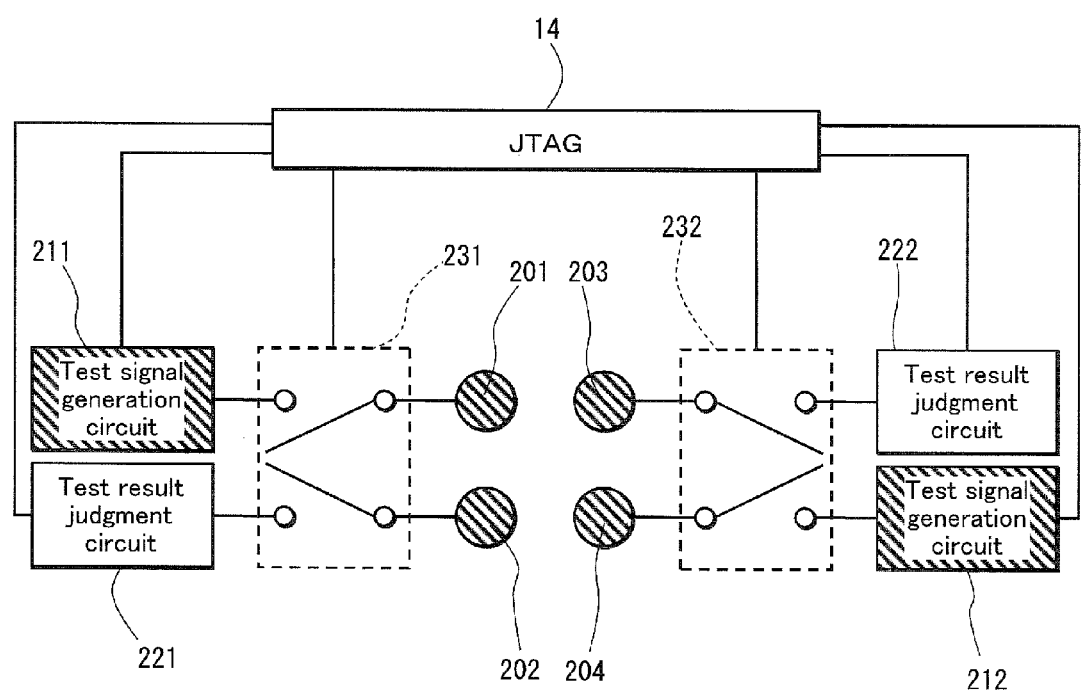
FIG. 4 is a block diagram of four adjacent TSVs 201-204 in the TSV region 12 and of their surrounding circuits illustrated in FIG. 2.

FIG. 4 is a block diagram of four adjacent TSVs 201-204 in the TSV region 12 and of their surrounding circuits. As illustrated in FIG. 4, the surrounding circuits include a first test signal generation circuit 211, a second test signal generation circuit 212, a first test result judgment circuit 221, a second test result judgment circuit 222, a first switch circuit 231, and a second switch circuit 232. The test signal generation circuits 211 and 212 are instructed by an external device through the JTAG interface 14, to begin generating a test signal. The first test signal generation circuit 211 generates a test signal in response to the instruction and outputs the test signal to the first switch circuit 231. The second test signal generation circuit 212 generates a test signal in response to the above instruction and outputs the test signal to the second switch circuit 232. The test result judgment circuits 221 and 222 store patterns of test signals in advance. The test result judgment circuits 221 and 222 are instructed by an external device through the JTAG interface 14, or by the test signal generation circuits 211 and 212, to begin judging the pattern of the test signal. In response to the instruction, the first test result judgment circuit 221 receives the signal from the first switch circuit 231 and judges whether the pattern of the signal matches the pattern of the test signal. In response to the above instruction, the second test result judgment circuit 222 receives the signal from the second switch circuit 232 and judges whether the pattern of the signal matches the pattern of the test signal. The results of judgment by the test result judgment circuits 221 and 222 represent the conducting state of the transmission path for the test signal. Information on the results of judgment is transmitted from each of the test result judgment circuits 221 and 222 to an external device through the JTAG interface 14. The first switch circuit 231 connects each of the first test signal generation circuit 211 and the first test result judgment circuit 221 to either one of the first TSV 201 and the second TSV 202. The second switch circuit 232 connects each of the second test signal generation circuit 212 and the second test result judgment circuit 222 to either one of the third TSV 203 and the fourth TSV 204. The switch circuits 231 and 232 select a destination in response to an instruction received from an external device through the JTAG interface 14.

First Connection Test

Figure 5:
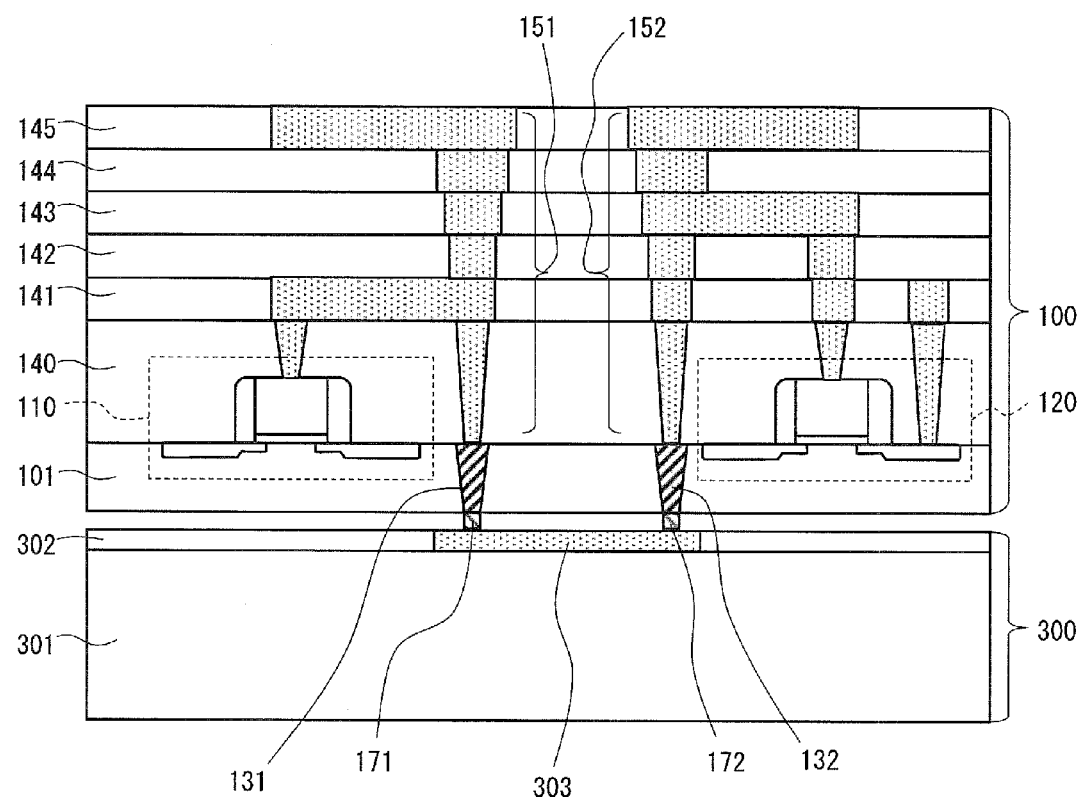
FIG. 5 is a cross-section diagram illustrating conditions during a connection test between a pair of TSVs 131 and 132 in a single chip 100 illustrated in FIG. 3.

FIG. 5 is a cross-section diagram illustrating conditions during a connection test between the pair of TSVs 131 and 132 in the chip 100 illustrated in FIG. 3. In this connection test, the conducting state of the pair of TSVs 131 and 132 is tested. Hereinafter, this connection test is referred to as the "first connection test". As illustrated in FIG. 5, during the first connection test, a test support substrate 300 is mounted on a surface of the substrate 101; on the opposite surface thereof the transistors 110 and 120 are implemented (i.e. the opposite surface is the circuit side). The test support substrate 300 includes an insulating plate 301, an insulator 302 and a testing wire 303. The insulating plate 301 is formed from silicon. The insulator 302 is formed from silicon oxide and covers the surface of the insulating plate 301 facing the chip 100. The testing wire 303 is a copper, aluminum, or other-metal pattern layered on a portion of the insulator 302. When the test support substrate 300 is mounted on the surface of the chip 100, the pair of adjacent TSVs 131 and 132 is connected by the testing wire 303 which is connected with the two microbumps 171 and 172.

Instead of silicon, the insulating plate 301 may be formed from epoxy resin, glass epoxy resin, or ceramic resin. In this case, the testing wire 303 may be formed directly on the insulating plate 301, without forming the insulator 302.

Figure 6A:
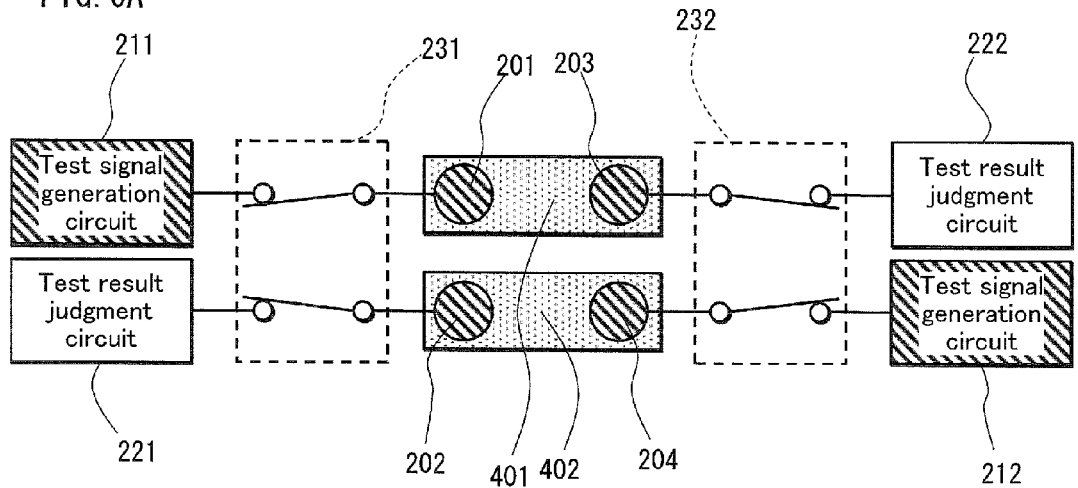
FIGS. 6A and 6B are schematic diagrams illustrating conditions during the first connection test on the four TSVs 201-204 illustrated in FIG. 4.
Figure 6B:
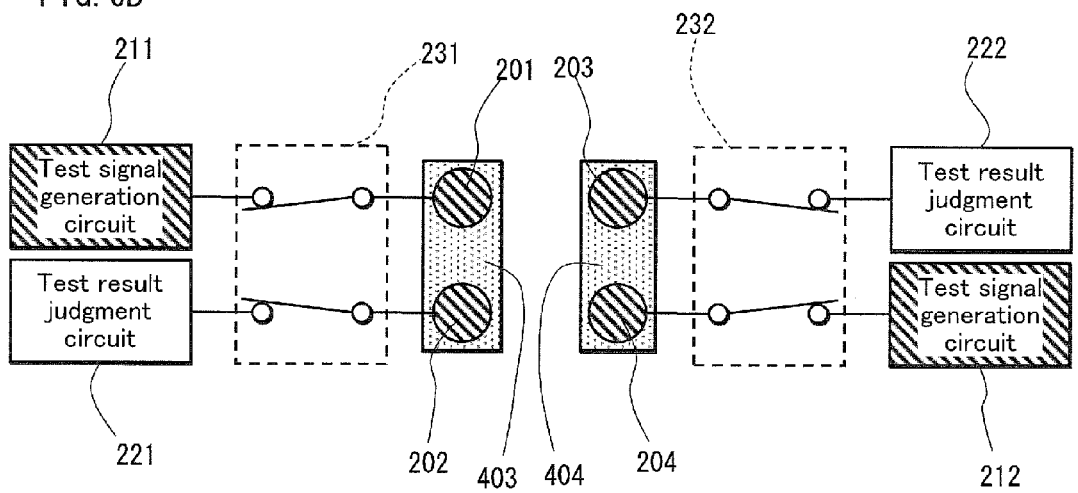

FIGS. 6A and 6B are schematic diagrams illustrating conditions during the first connection test on the four TSVs 201-204 illustrated in FIG. 4. During the first connection test, the test support substrate is mounted on a chip. As a result, among the four TSVs 201-204 arranged in a grid, each pair of either vertically or horizontally adjacent TSVs is connected by the testing wire.

FIG. 6A is a schematic diagram illustrating conditions when each pair of horizontally adjacent TSVs is connected by a testing wire. As illustrated in FIG. 6A, the first TSV 201 and the third TSV 203 are connected by a first testing wire 401, whereas the second TSV 202 and the fourth TSV 204 are connected by a second testing wire 402. The first switch circuit 231 connects the first test signal generation circuit 211 with the first TSV 201 and connects the first test result judgment circuit 221 with the second TSV 202. On the other hand, the second switch circuit 232 connects the second test signal generation circuit 212 with the fourth TSV 204 and connects the second test result judgment circuit 222 with the third TSV 203. As a result, the test signal output by the first test signal generation circuit 211 passes through the first switch circuit 231, the first TSV 201, the first testing wire 401, the third TSV 203, and the second switch circuit 232, and then the test signal is received by the second test result judgment circuit 222. The second test result judgment circuit 222 compares the pattern of the received signal with the pattern of the test signal. Based on the comparison results, it is possible to determine whether a connection fault due to a void has occurred in either the first TSV 201 or the third TSV 203. On the other hand, the test signal output by the second test signal generation circuit 212 passes through the second switch circuit 232, the fourth TSV 204, the second testing wire 402, the second TSV 202, and the first switch circuit 231, and then the test signal is received by the first test result judgment circuit 221. The first test result judgment circuit 221 compares the pattern of the received signal with the pattern of the test signal. Based on the comparison results, it is possible to determine whether a connection fault due to a void has occurred in either the second TSV 202 or the fourth TSV 204.

FIG. 6B is a schematic diagram illustrating conditions when each pair of vertically adjacent TSVs is connected by a testing wire. As illustrated in FIG. 6B, the first TSV 201 and the second TSV 202 are connected by the third testing wire 403, whereas the third TSV 203 and the fourth TSV 204 are connected by the fourth testing wire 404. The first switch circuit 231 connects the first test signal generation circuit 211 with the first TSV 201 and connects the first test result judgment circuit 221 with the second TSV 202. On the other hand, the second switch circuit 232 connects the second test signal generation circuit 212 with the fourth TSV 204 and connects the second test result judgment circuit 222 with the third TSV 203. As a result, the test signal output by the first test signal generation circuit 211 passes through the first switch circuit 231, the first TSV 201, the third testing wire 403, the second TSV 202, and the first switch circuit 231, and then the test signal is received by the first test result judgment circuit 221. The first test result judgment circuit 221 compares the pattern of the received signal with the pattern of the test signal. Based on the comparison results, it is possible to determine whether a connection fault due to a void has occurred in either the first TSV 201 or the second TSV 202. On the other hand, the test signal output by the second test signal generation circuit 212 passes through the second switch circuit 232, the fourth TSV 204, the fourth testing wire 404, the third TSV 203, and the second switch circuit 232, and then the test signal is received by the second test result judgment circuit 222. The second test result judgment circuit 222 compares the pattern of the received signal with the pattern of the test signal. Based on the comparison results, it is possible to determine whether a connection fault due to a void has occurred in either the third TSV 203 or the fourth TSV 204.

The first connection test may be performed at the point which a plurality of chips are formed on one wafer (wafer level), or at the point which each chip is cut off the wafer (die level). When performing the first connection test at the die level, however, it is necessary to decrease the size of the test support substrate to approximately the same size as the chip. It is also necessary to mount the test support substrate on chips one at a time. For these reasons, it is more efficient to perform the first connection test at the wafer level.

Second Connection Test

Figure 7:
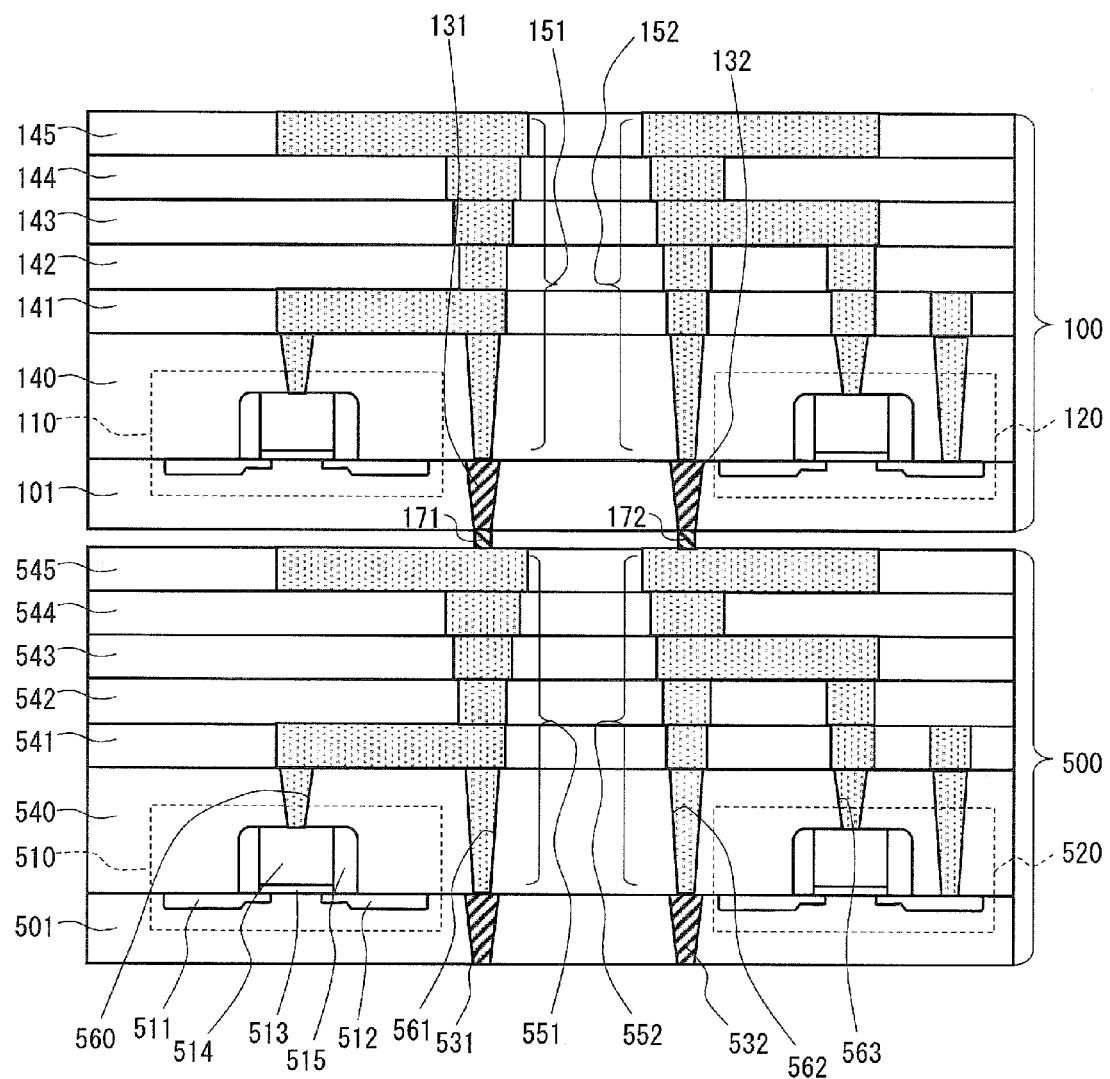
FIG. 7 is a cross-sectional diagram illustrating conditions when performing a connection test on a pair of TSVs 131 and 132 after layering the first chip 100 illustrated in FIG. 3 on a second chip 500.

FIG. 7 is a cross-sectional diagram illustrating conditions when performing a connection test on a pair of TSVs 131 and 132 after layering the chip 100 illustrated in FIG. 3 (hereinafter referred to as the "first chip") on another chip 500 (hereinafter referred to as the "second chip"). Hereinafter, this connection test is referred to as the "second connection test". As illustrated in FIG. 7, in the pair of chips according to Embodiment 1, the surface of an insulator 545 farthest towards the outside in the second chip (i.e. the circuit side) faces the surface of the substrate 101 in the first chip 100. The first chip 100 and the second chip 500 may have core circuits with different functions or structures, or may have core circuits with the same functions and structures. In the second connection test, the conducting state of each pair of TSVs 131 and 132 is tested individually.

As illustrated in FIG. 7, the same as the first chip 100, the second chip 500 includes a substrate 501, a third transistor 510, a fourth transistor 520, a fifth TSV 531, a sixth TSV 532, interlayer insulator 540-545, third interconnection 551, and fourth interconnection 552. The substrate 501 is formed from silicon. The transistors 510 and 520 are MOS transistors formed on the substrate 101 and include a first diffusion region 511, a second diffusion region 512, a gate oxide film 513, a gate electrode 514, and side walls 515. Each of these components is the same as in the transistors 110 and 120 formed on the first chip 100. The TSVs 531 and 532 have a structure including a hole that penetrates through the substrate 501 and is filled with conductive material. Polysilicon, copper, tungsten, aluminum, or nickel is used as the conductive material. The interlayer insulators 540-545 cover the surface of the second chip 500 and are formed like the interlayer insulators 140-145 covering the first chip 100. An aluminum or copper pattern is formed on each of the interlayer insulators 541-545, and together the patterns form the interconnections 551 and 552. In the lowest interlayer insulator 540, a fifth contact hole 560 through eighth contact hole 563 are formed. The fifth contact hole 560 exposes the gate electrode 514 of the third transistor 510. The sixth contact hole 561 exposes an end of the third TSV 531. The seventh contact hole 562 exposes an end of the fourth TSV 532. The eighth contact hole 563 exposes the gate electrode of the fourth transistor 520. The third interconnection 551 is connected through the fifth contact hole 561 to the gate electrode 514 of the third transistor 510 and connected through the sixth contact hole 561 to the third TSV 531. The fourth interconnection 552 is connected through the seventh contact hole 562 to the fourth TSV 532 and connected through the eighth contact hole 563 to the gate electrode of the fourth transistor 520. In the second chip 500 as well, a plurality of transistors, the same as the transistors 510 and 520, are combined to form the core circuits 11 illustrated in FIG. 1 and the test signal generation circuit 22, the test result judgment circuit 23, and the switch circuit 24 illustrated in FIG. 2.

As further illustrated in FIG. 7, between the first chip 100 and the second chip 500, the first TSV 131 and the third interconnection 551 are connected by the first microbump 171, and the second TSV 132 and the fourth interconnection 552 are connected by the second microbump 172. As a result, the first TSV 131 is connected to the third TSV 531, and the second TSV 132 is connected to the fourth TSV 532. Furthermore, through the first TSV 131 and the second TSV 132, the test signal generation circuits, test result judgment circuits, and switch circuits implemented on the first chip 100 are connected to the test signal generation circuits, test result judgment circuits, and switch circuits implemented on the second chip 500. With the chips in this state, the second connection test is performed.

Figure 8A:
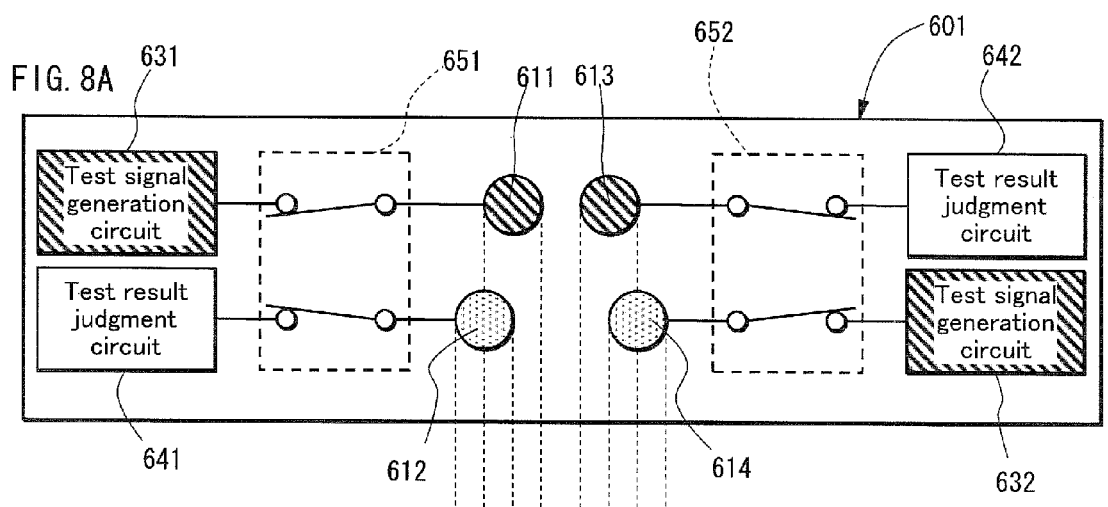
FIGS. 8A and 8B are schematic diagrams illustrating conditions during the second connection test with chips 601 and 602 layered as illustrated in FIG. 7.
Figure 8B:
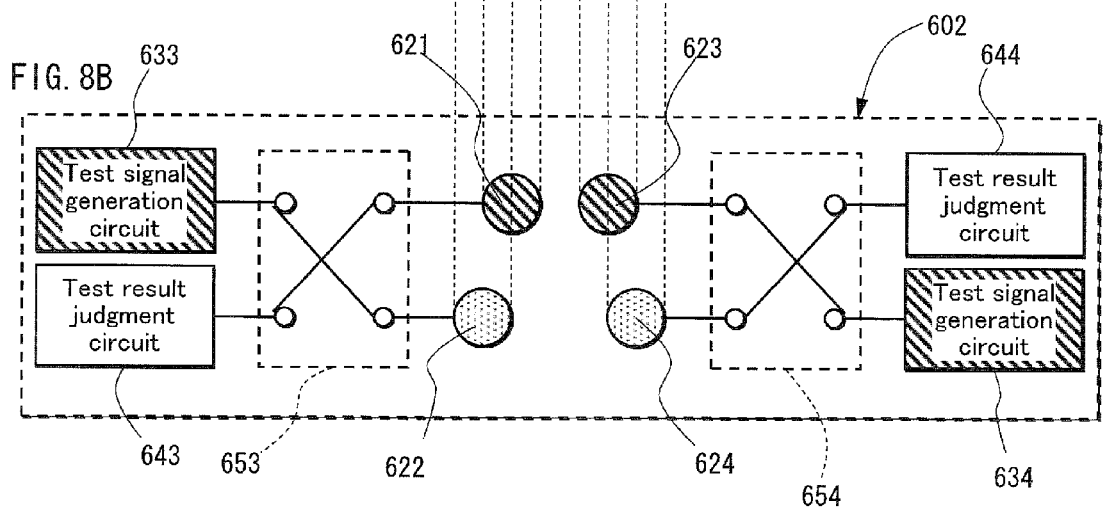

FIGS. 8A and 8B are schematic diagrams illustrating conditions during the second connection test with the chips 601 and 602 layered as illustrated in FIG. 7. FIG. 8A is a block diagram of four TSVs and their surrounding circuits in the upper chip 601 (hereinafter referred to as the "first chip"), and FIG. 8B is a block diagram of four TSVs and their surrounding circuits in the lower chip 602 (hereinafter referred to as the "second chip"). The same as the four TSVs illustrated in FIG. 4, four TSVs 611-614 and 621-624 are adjacent to each other in the respective chips 601 and 602, and are connected to different interconnections. Furthermore, between the first chip 601 and the second chip 602, like the third interconnection 551 and the fourth interconnection 552 illustrated in FIG. 7, interconnections formed on the second chip 602 are connected to pairs of TSVs that are adjacent along a normal line between the chips 601 and 602. Specifically, as indicated by the dashed lines in FIGS. 8A and 8B, a first TSV 611 and a fifth TSV 621 are connected, a second TSV 612 and a sixth TSV 622 are connected, a third TSV 613 and a seventh TSV 623 are connected, and a fourth TSV 614 and an eighth TSV 624 are connected.

The first chip 601 includes a first test signal generation circuit 631, a second test signal generation circuit 632, a first test result judgment circuit 641, a second test result judgment circuit 642, a first switch circuit 651, and a second switch circuit 652. The second chip 602 includes a third test signal generation circuit 633, a fourth test signal generation circuit 634, a third test result judgment circuit 643, a fourth test result judgment circuit 644, a third switch circuit 653, and a fourth switch circuit 654. The test signal generation circuits 631-634 are instructed by an external device through a JTAG interface, to begin generating a test signal. The test signal generation circuits 631-634 generate a test signal in response to the instruction and output the test signal to the TSVs 611-614 and 621-624. The test result judgment circuits 641-644 store patterns of test signals in advance. The test result judgment circuits 641-644 are instructed by an external device through the JTAG interface, or by the test signal generation circuits 631-634, to begin judging the pattern of the test signal. In response to the instruction, the test result judgment circuits 641-644 receive the signal from the TSVs 611-614 and 621-624 and judge whether the pattern of the signal matches the pattern of the test signal. The first switch circuit 651 connects each of the first test signal generation circuit 631 and the first test result judgment circuit 641 to either one of the first TSV 611 and the second TSV 612. The second switch circuit 652 connects each of the second test signal generation circuit 632 and the second test result judgment circuit 642 to either one of the third TSV 613 and the fourth TSV 614. The third switch circuit 653 connects each of the third test signal generation circuit 633 and the third test result judgment circuit 643 to either one of the fifth TSV 621 and the sixth TSV 622. The fourth switch circuit 654 connects each of the fourth test signal generation circuit 634 and the fourth test result judgment circuit 644 to either one of the seventh TSV 623 and the eighth TSV 624. The switch circuits 651-654 select a destination in response to an instruction received from an external device through the JTAG interface.

While not illustrated in FIGS. 8A and 8B, core circuits with a variety of functions are implemented on the chips 601 and 602. The TSVs 611-614 and 621-624 are connected to the respective core circuits. The chips 601 and 602 may also include test circuits such as BIST circuits.

During the second connection test, the switch circuits 651-654 are set as illustrated in FIGS. 8A and 8B. Specifically, as illustrated in FIG. 8A, the first switch circuit 651 connects the first test signal generation circuit 631 with the first TSV 611 and connects the first test result judgment circuit 641 with the second TSV 612. On the other hand, the second switch circuit 652 connects the second test signal generation circuit 632 with the fourth TSV 614 and connects the second test result judgment circuit 642 with the third TSV 613. As illustrated in FIG. 8B, the third switch circuit 653 connects the third test signal generation circuit 633 with the sixth TSV 622 and connects the third test result judgment circuit 643 with the fifth TSV 621. On the other hand, the fourth switch circuit 654 connects the fourth test signal generation circuit 634 with the seventh TSV 623 and connects the fourth test result judgment circuit 644 with the eighth TSV 624.

The test signal output by the first test signal generation circuit 631 passes through the first switch circuit 651, the first TSV 611, and the third switch circuit 653, and then the test signal is received by the third test result judgment circuit 643. The third test result judgment circuit 643 compares the pattern of the received signal with the pattern of the test signal. Based on the comparison results, it is possible to determine whether a connection fault has occurred between the first TSV 611 and the second chip 602 due to misalignment of a TSV, a junction fault at a microbump, or another such reason.

The test signal output by the second test signal generation circuit 632 passes through the second switch circuit 652, the fourth TSV 614, and the fourth switch circuit 654, and then the test signal is received by the fourth test result judgment circuit 644. The fourth test result judgment circuit 644 compares the pattern of the received signal with the pattern of the test signal. Based on the comparison results, it is possible to determine whether a connection fault has occurred between the fourth TSV 614 and the second chip 602 due to misalignment of a TSV, a junction fault at a microbump, or another such reason.

The test signal output by the third test signal generation circuit 633 passes through the third switch circuit 653, the second TSV 612, and the first switch circuit 651, and then the test signal is received by the first test result judgment circuit 641. The first test result judgment circuit 641 compares the pattern of the received signal with the pattern of the test signal. Based on the comparison results, it is possible to determine whether a connection fault has occurred between the second TSV 612 and the second chip 602 due to misalignment of a TSV, a junction fault at a microbump, or another such reason.

The test signal output by the fourth test signal generation circuit 634 passes through the fourth switch circuit 654, the third TSV 613, and the second switch circuit 652, and then the test signal is received by the second test result judgment circuit 642. The second test result judgment circuit 642 compares the pattern of the received signal with the pattern of the test signal. Based on the comparison results, it is possible to determine whether a connection fault has occurred between the third TSV 613 and the second chip 602 due to misalignment of a TSV, a junction fault at a microbump, or another such reason.

FIGS. 9A, 9B, and 9C are schematic diagrams illustrating conditions during the second connection test with chips 701, 702, and 703 layered. FIG. 9A is a block diagram of four TSVs and their surrounding circuits in the uppermost chip 701 (hereinafter referred to as the "first chip"), FIG. 9B is a block diagram of four TSVs and their surrounding circuits in the middle chip 702 (hereinafter referred to as the "second chip"), and FIG. 9C is a block diagram of four TSVs and their surrounding circuits in the lowest chip 703 (hereinafter referred to as the "third chip"). The same as the four TSVs illustrated in FIG. 4, four TSVs 711-714, 721-724, and 731-734 are adjacent to each other in the respective chips 701-703, and are connected to different interconnections. Furthermore, between the first chip 701 and the second chip 702, interconnections formed on the second chip 702 are connected to pairs of TSVs that are adjacent along a normal line between the chips 701 and 702. Specifically, as indicated by the dashed lines in FIGS. 9A, 9B, and 9C, a first TSV 711 and a fifth TSV 721 are connected, a second TSV 712 and a sixth TSV 722 are connected, a third TSV 713 and a seventh TSV 723 are connected, and a fourth TSV 714 and an eighth TSV 724 are connected. Similarly, between the second chip 702 and the third chip 703, interconnections formed on the third chip 703 are connected pairs of TSVs that are adjacent along a normal line between the chips 702 and 703. Specifically, as indicated by the dashed lines in FIGS. 9A, 9B, and 9C, the fifth TSV 721 and a ninth TSV 731 are connected, the sixth TSV 722 and a tenth TSV 732 are connected, the seventh TSV 723 and an eleventh TSV 733 are connected, and the eighth TSV 724 and a twelfth TSV 734 are connected.

Like the chips 601 and 602 illustrated in FIGS. 8A and 8B, a group of a test signal generation circuit, a test result judgment circuit, and a switch circuit is connected to each pair of adjacent TSVs in the chips 701-703. The test signal generation circuits are instructed by an external device through a JTAG interface, to begin generating a test signal. The test signal generation circuits generate a test signal in response to the instruction and output the test signal to the TSVs. The test result judgment circuits are instructed by an external device through the JTAG interface, or by the test signal generation circuits, to begin judging the pattern of the test signal. In response to the instruction, the test result judgment circuits receive the signal from the TSVs and judge whether the pattern of the signal matches the pattern of the test signal. The switch circuits connect each of the test signal generation circuits and the test result judgment circuits to either one of a pair of TSVs. The destination is selected in response to an instruction received from an external device through the JTAG interface.

During the second connection test, the switch circuits are set as shown in FIGS. 9A, 9B, and 9C. Specifically, in the first chip 701, as illustrated in FIG. 9A, a first switch circuit 761 connects a first test signal generation circuit 741 with the first TSV 711 and connects a first test result judgment circuit 751 with the second TSV 712. On the other hand, a second switch circuit 762 connects a second test signal generation circuit 742 with the fourth TSV 714 and connects a second test result judgment circuit 752 with the third TSV 713. In the second chip 702, as illustrated in FIG. 9B, a third switch circuit 763 isolates both a third test signal generation circuit 743 and a third test result judgment circuit 753 from the fifth TSV 721 and the sixth TSV 722. Similarly, a fourth switch circuit 764 isolates both a fourth test signal generation circuit 744 and a fourth test result judgment circuit 754 from the seventh TSV 723 and the eighth TSV 724. In the third chip 703, as illustrated in FIG. 9C, a fifth switch circuit 765 connects a fifth test signal generation circuit 745 with the tenth TSV 732 and connects a fifth test result judgment circuit 755 with the ninth TSV 731. On the other hand, the sixth switch circuit 766 connects a sixth test signal generation circuit 746 with the eleventh TSV 733 and connects a sixth test result judgment circuit 756 with the twelfth TSV 734.

The test signal output by the first test signal generation circuit 741 passes through the first switch circuit 761, the first TSV 711, the fifth TSV 721, and the fifth switch circuit 765, and then the test signal is received by the fifth test result judgment circuit 755. The fifth test result judgment circuit 755 compares the pattern of the received signal with the pattern of the test signal. Based on the comparison results, it is possible to determine whether a connection fault has occurred between the first TSV 711 and the second chip 702, or between the fifth TSV 721 and the third chip 703, due to misalignment of a TSV, a junction fault at a microbump, or another such reason.

The test signal output by the second test signal generation circuit 742 passes through the second switch circuit 762, the fourth TSV 714, the eighth TSV 724, and the sixth switch circuit 766, and then the test signal is received by the sixth test result judgment circuit 756. The sixth test result judgment circuit 756 compares the pattern of the received signal with the pattern of the test signal. Based on the comparison results, it is possible to determine whether a connection fault has occurred between the fourth TSV 714 and the second chip 702, or between the eighth TSV 724 and the third chip 703, due to misalignment of a TSV, a junction fault at a microbump, or another such reason.

The test signal output by the fifth test signal generation circuit 745 passes through the fifth switch circuit 765, the sixth TSV 722, the second TSV 712, and the first switch circuit 761, and then the test signal is received by the first test result judgment circuit 751. The first test result judgment circuit 751 compares the pattern of the received signal with the pattern of the test signal. Based on the comparison results, it is possible to determine whether a connection fault has occurred between the second TSV 712 and the second chip 702, or between the sixth TSV 722 and the third chip 703, due to misalignment of a TSV, a junction fault at a microbump, or another such reason.

The test signal output by the sixth test signal generation circuit 746 passes through the sixth switch circuit 766, the seventh TSV 723, the third TSV 713, and the second switch circuit 762, and then the test signal is received by the second test result judgment circuit 752. The second test result judgment circuit 752 compares the pattern of the received signal with the pattern of the test signal. Based on the comparison results, it is possible to determine whether a connection fault has occurred between the third TSV 713 and the second chip 702, or between the seventh TSV 723 and the third chip 703, due to misalignment of a TSV, a junction fault at a microbump, or another such reason.

As has been described, in the three-dimensional integrated circuit according to Embodiment 1 of the present invention, each chip is provided with a set of a test signal generation circuit, a test result judgment circuit, and a switch circuit for each pair of TSVs. The switch circuit connects one of the corresponding TSV pair to the test signal generation circuit and connects the other to the test result judgment circuit. As a result, before layering a plurality of chips, it is possible to detect the conducting state of two TSVs by connecting the TSVs together. On the other hand, after layering the plurality of chips, the test signal generation circuit in one chip outputs a test signal, and the test result judgment circuit in another chip receives the test signal; this enables the conducting state of TSVs between the chips to be detected. In this way, both before and after layering a plurality of chips, the same test circuits can be used to test the TSVs that connect the plurality of chips. Using the same test circuits improves the efficiency of testing.

Method of Manufacturing Three-Dimensional Integrated Circuits

FIG. 10 is a flowchart of the method of manufacturing three-dimensional integrated circuits according to Embodiment 1 of the present invention. In this method of manufacturing, the first connection test is first performed on individual chips. The first connection test may be performed at either the wafer level or the die level. Next, chips that passed the first connection test are layered, and the second connection test is performed. At this point, the layering may be either of the following two forms. In the first form (Die to Die), two chips to be layered are cut off from the wafer and then layered. In the other form (Die to Wafer), a chip already cuff off from the wafer is layered onto a chip not yet cut off from the wafer.

In step S801, a plurality of chips to be layered is manufactured. The chips may be manufactured in parallel. For example, the structure illustrated in FIG. 1 is formed on a substrate 101. A plurality of chips to be layered may have core circuits with different functions or structures, or may have core circuits with the same functions and structures. Thereafter, processing proceeds to step S802.

In step S802, tests are performed on the circuits implemented on each chip. These tests include a functional test and the timing test and are performed by using a test circuit, such as a BIST circuit implemented on the chip using DFT. Thereafter, processing proceeds to step S803.

In step S803, it is determined whether the test results are normal or not. If the test results are normal, processing proceeds to step S804. Otherwise, processing proceeds to step S811.

In step S804, as illustrated in FIG. 5, a test support substrate is mounted onto the chip to connect a pair of TSVs connected to different interconnections. Thereafter, processing proceeds to step S805.

In step S805, the first connection test is performed individually on each chip. Specifically, as illustrated in FIGS. 6A and 6B, each switch circuit connects one of the pair of TSVs, which are connected by the testing wire, to the test signal generation circuit and connects the other to the test result judgment circuit. Next, the test signal generation circuits are instructed by an external device through the JTAG interface, to begin generating a test signal. The test signal generation circuits generate a test signal in response to the instruction and output the test signal to the TSVs. Furthermore, the test result judgment circuits are instructed by an external device through the JTAG interface, or by the test signal generation circuits, to begin judging the pattern of the test signal. In response to the instruction, each test result judgment circuit receives the signal from the TSV connected thereto by the switch circuit. Thereafter, processing proceeds to step S806.

In step S806, each test result judgment circuit compares the pattern of the received signal with the pattern of the test signal. If the pattern of each signal matches the pattern of the test signal, neither of the TSVs in the pair of TSVs that transmitted the signals has a connection fault due to a void. Processing therefore proceeds to step S807. If the pattern of each signal does not match the pattern of the test signal, one of the TSVs in the pair of TSVs that transmitted the signals has a connection fault due to a void. Processing therefore proceeds to step S811.

In step S807, the chips that passed the first connection test are layered onto other chips. The form of layering may be either Die to Die or Die to Wafer. As a result, as illustrated in FIG. 7, the TSVs in the upper chip are connected to the interconnections in the lower chip. Thereafter, processing proceeds to step S808.

In step S808, the second connection test is performed on the entire set of layered chips. Specifically, as illustrated in FIGS. 8A and 8B, the TSVs connecting two chips are each connected to the test signal generation circuit in one chip or the test result judgment circuit in the other chip. Next, the test signal generation circuits are instructed by an external device through the JTAG interface, to begin generating a test signal. The test signal generation circuits generate a test signal in response to the instruction and output the test signal to the TSVs. Furthermore, the test result judgment circuits are instructed by an external device through the JTAG interface or by the test signal generation circuits, to begin judging the pattern of the test signal. In response to the instruction, each test result judgment circuit receives the signal from the TSV connected thereto. Thereafter, processing proceeds to step S809.

In step S809, the test result judgment circuits compare the pattern of the received signal with the pattern of the test signal. If the pattern of the signal matches the pattern of the test signal, no connection fault has occurred between the TSV that transmitted the signal and the chip due to misalignment of a TSV, a junction fault at a microbump, or another such reason. If there is no connection fault in any of the TSVs connecting the chips, processing proceeds to step S810. If a connection fault has occurred in any of the TSVs, processing proceeds to step S811.

In step S810, since the layered chips and all the TSVs connecting the chips are normal, the chips are packaged as one three-dimensional integrated circuit. The three-dimensional integrated circuit according to Embodiment 1 of the present invention is thus complete.

In step S811, either a chip or a TSV is defective. Therefore, either an individual chip or an entire set of layered chips is screened as defective and discarded.

Modifications (A) The TSVs illustrated in FIGS. 1 and 2 are placed in a grid in the central region of the chip 100. Alternatively, the TSVs may be placed at any other location in the chip. Furthermore, the circuit layout within the test circuit regions 13 illustrated in FIG. 2 is only an example. As long as the group of the test signal generation circuit 22, the test result judgment circuit 23, and the switch circuit 24 is placed adjacent to a pair of TSVs 21, the relative positions of these circuits may be freely modified. Additionally, in FIG. 4, the switch circuits 231 and 232 are connected to two vertically adjacent TSVs (201, 202) and (203, 204). The switch circuits 231 and 232 may instead be connected to two horizontally adjacent TSVs (201, 203) and (202, 204).

(B) During the first connection test, as illustrated in FIG. 5, two adjacent TSVs are connected by a testing wire. As a result, the lengths of the wires between the TSV region and the test circuit region, as well as the length of the testing wire, are reduced to the necessary minimum. Alternatively, two TSVs placed distant from each other may be connected like the pairs of TSVs illustrated in FIGS. 6A and 6B.

(C) In FIG. 7, the first TSV 131 and the third interconnection 551 are connected by the first microbump 171, whereas the second TSV 132 and the fourth interconnection 552 are connected by the second microbump 172. Alternatively, the first TSV 131 may be connected to the third interconnection 551 without the microbump, and the second TSV 132 may be connected to the fourth interconnection 552 without the microbump. Furthermore, an interposer may be inserted between the microbump and the interconnection layer of the lower chip, and the microbump may be connected to the interconnection layer of the lower chip by wires formed on the surface of the interposer.

(D) In FIG. 7, the substrate of the upper chip is connected to the interconnection layer of the lower chip. Alternatively, by flipping the top and bottom of the lower chip, the substrate of the upper chip may be connected to the substrate of the lower chip.

(E) In the flowchart illustrated in FIG. 10, after the functional test and the timing test performed in step S802, the first connection test is performed in step S805. Alternatively, the first connection test may be performed in parallel with the functional test and the timing test. This approach shortens the test time.

(F) In the flowchart illustrated in FIG. 10, in step S808, only the second connection test is performed on the entire set of layered chips. Alternatively, as in step S802, the functional test and the timing test may be performed on the circuits implemented on each chip. This approach allows for confirmation of whether layering of the chips has caused a defect to occur in circuitry other than the TSVs. Furthermore, these tests may be performed in parallel with the second connection test. This approach shortens the test time.

(G) In the flowchart illustrated in FIG. 10, in steps S806 and S809, a chip is screened as defective if a connection fault occurs in any of the TSVs. Alternatively, a spare TSV referred to as a redundancy relief TSV may be provided in advance on the chip, and if a connection fault occurs in one of the TSVs, the redundancy relief TSV may be used in place of the TSV with a connection fault. This approach maintains a high chip yield.

Embodiment 2

Chips according to Embodiment 2 of the present invention differ from chips according to Embodiment 1 in that the test circuit region does not include a switch circuit. Other elements of the chips according to Embodiment 2 are similar to those of the chips according to Embodiment 1. Details on similar elements can be found in the description of Embodiment 1.

Figure 11:
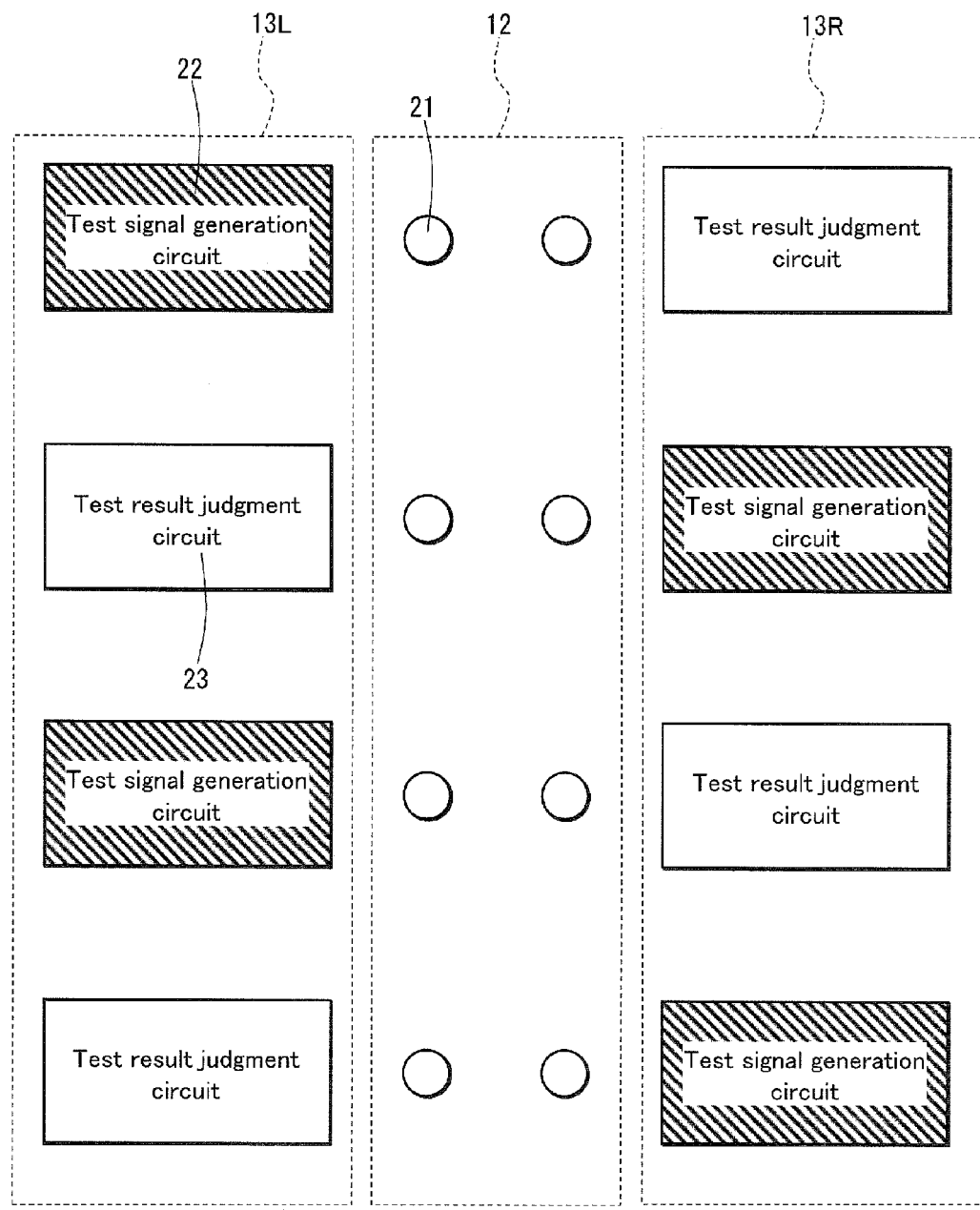
FIG. 11 is a schematic diagram illustrating the planar structure of the TSV region 12 and of test circuit regions 13L and 13R in the chips according to Embodiment 2 of the present invention.

FIG. 11 is a schematic diagram illustrating the planar structure of a TSV region 12 and of test circuit regions 13L and 13R in the chips of Embodiment 2. As illustrated in FIG. 11, a plurality of TSVs 21 is placed in two rows in the TSV region 12. The diameter of each TSV 21 is several micrometers. The interval between each TSV 21 is several dozen micrometers. In the test circuit regions 13L and 13R, a pair of a test signal generation circuit 22 and a test result judgment circuit 23 is adjacent to each pair of TSVs 21. Furthermore, with respect to the TSV region 12, the placed order of the test signal generation circuits 22 and the test result judgment circuits 23 is reversed between the test circuit region 13L on the left and the test circuit region 13R on the right. As a result, as illustrated in FIG. 11, the test signal generation circuits 22 and the test result judgment circuits 23 are placed in a zigzag lattice pattern, with the TSV region 12 therebetween. Each test signal generation circuit 22 thus faces a test result judgment circuit 23 in another test circuit region, with the TSV region 12 therebetween.

Figure 12:
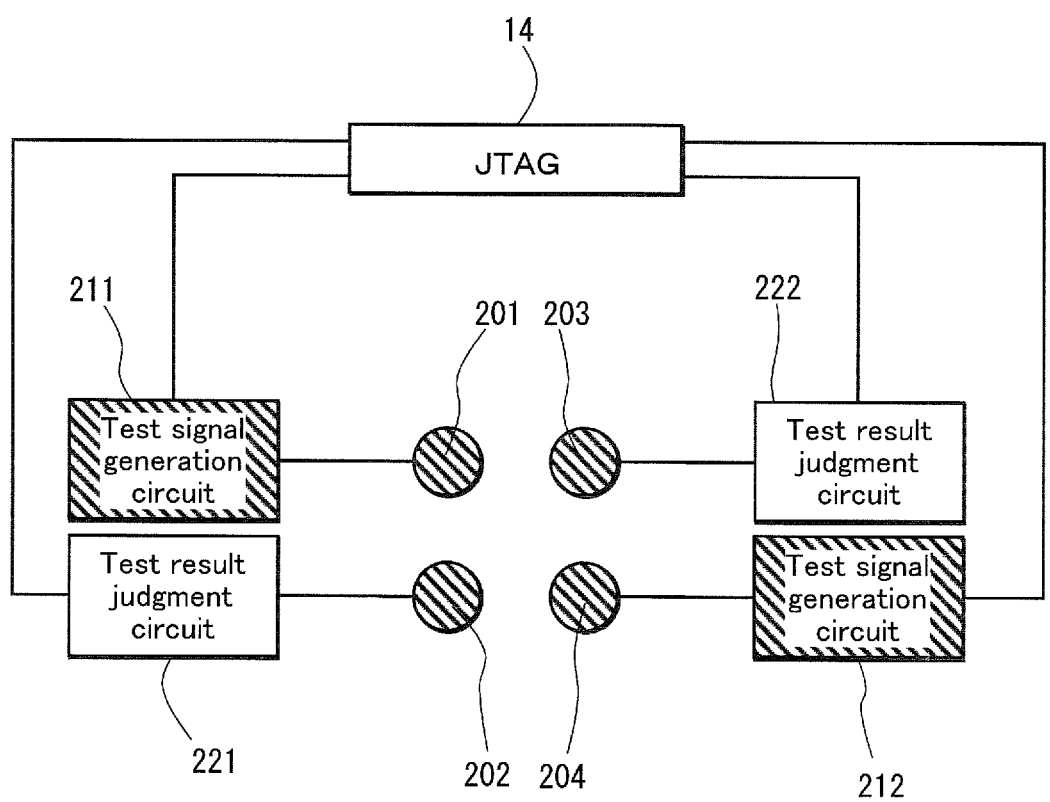
FIG. 12 is a block diagram of four adjacent TSVs 201-204 in the TSV region 12 and of their surrounding circuits illustrated in FIG. 11.

FIG. 12 is a block diagram of four adjacent TSVs 201-204 in the TSV region 12 and of their surrounding circuits. As illustrated in FIG. 12, the surrounding circuits include the first test signal generation circuit 211, the second test signal generation circuit 212, the first test result judgment circuit 221, and the second test result judgment circuit 222. The first test signal generation circuit 211 is connected to the first TSV 201. The first test result judgment circuit 221 is connected to the second TSV 202. The second test signal generation circuit 212 is connected to the fourth TSV 204. The second test result judgment circuit 222 is connected to the third TSV 203. The test signal generation circuits 211 and 212 are instructed by an external device through the JTAG interface 14, to begin generating a test signal. The first test signal generation circuit 211 generates a test signal in response to the instruction and outputs the test signal to the first TSV 201. The second test signal generation circuit 212 generates a test signal in response to the instruction and outputs the test signal to the fourth TSV 204. The test result judgment circuits 221 and 222 store patterns of test signals in advance. The test result judgment circuits 221 and 222 are instructed by an external device through the JTAG interface 14, or by the test signal generation circuits 211 and 212, to begin judging the pattern of the test signal. In response to the instruction, the first test result judgment circuit 221 receives the signal from the second TSV 202 and judges whether the pattern of the signal matches the pattern of the test signal. In response to the instruction, the second test result judgment circuit 222 receives the signal from the third TSV 203 and judges whether the pattern of the signal matches the pattern of the test signal. The results of judgment by the test result judgment circuits 221 and 222 represent the conducting state of the transmission paths for the test signals. Information on the results of judgment is transmitted from each of the test result judgment circuits 221 and 222 to an external device through the JTAG interface 14.

First Connection Test

During the first connection test, as illustrated in FIG. 5, a test support substrate is mounted onto the chip. As a result, as illustrated in FIGS. 6A and 6B, among the four TSVs 201-204, each pair of either vertically or horizontally adjacent TSVs is connected by the testing wire.

As illustrated in FIG. 6A, when two horizontally adjacent TSVs are connected by the testing wire, the test signal output by the first test signal generation circuit 211 passes through the first TSV 201, the first testing wire 401, and the third TSV 203 to be received by the second test result judgment circuit 222. The second test result judgment circuit 222 compares the pattern of the received signal with the pattern of the test signal. Based on the results of comparison, it is possible to determine whether a connection fault due to a void has occurred in either the first TSV 201 or the third TSV 203. On the other hand, the test signal output by the second test signal generation circuit 212 passes through the fourth TSV 204, the second testing wire 402, and the second TSV 202, and then the test signal is received by the first test result judgment circuit 221. The first test result judgment circuit 221 compares the pattern of the received signal with the pattern of the test signal. Based on the comparison results, it is possible to determine whether a connection fault due to a void has occurred in either the second TSV 202 or the fourth TSV 204.

As illustrated in FIG. 6B, when two vertically adjacent TSVs are connected by the testing wire, the test signal output by the first test signal generation circuit 211 passes through the first TSV 201, the third testing wire 403, and the second TSV 202, and then the test signal is received by the first test result judgment circuit 221. The first test result judgment circuit 221 compares the pattern of the received signal with the pattern of the test signal. Based on the comparison results, it is possible to determine whether a connection fault due to a void has occurred in either the first TSV 201 or the second TSV 202. On the other hand, the test signal output by the second test signal generation circuit 212 passes through the fourth TSV 204, the fourth testing wire 404, and the third TSV 203, and then the test signal is received by the second test result judgment circuit 222. The second test result judgment circuit 222 compares the pattern of the received signal with the pattern of the test signal. Based on the comparison results, it is possible to determine whether a connection fault due to a void has occurred in either the third TSV 203 or the fourth TSV 204.

Second Connection Test

Figure 13:
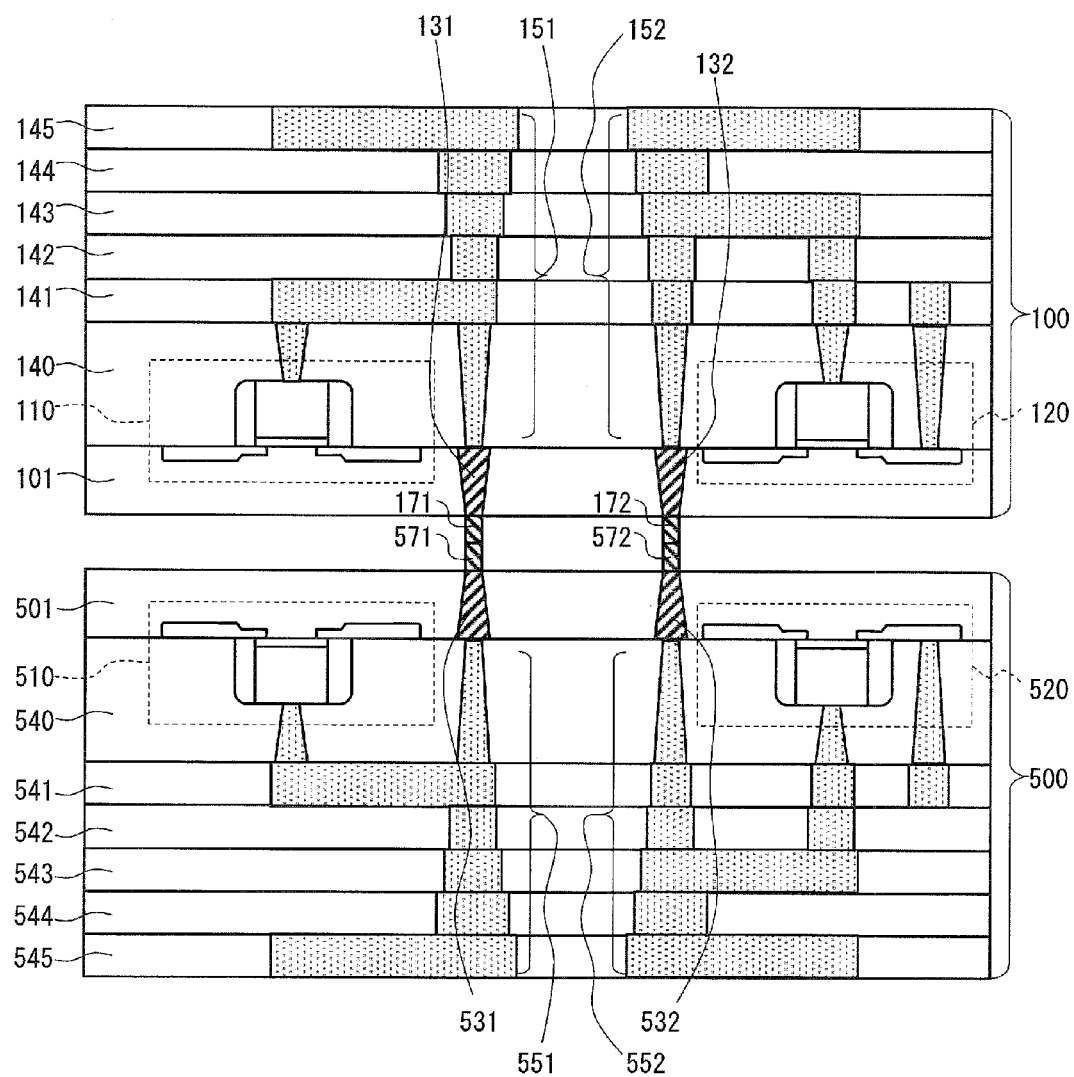
FIG. 13 is a cross-sectional diagram illustrating conditions when performing the second connection test on two pairs of TSVs 131, 132 and 531, 532, after layering the first chip 100 illustrated in FIG. 12 on the second chip 500.

FIG. 13 is a cross-sectional diagram illustrating conditions when performing the second connection test on two pairs of TSVs 131, 132 and 531, 532, after layering the first chip 100 illustrated in FIG. 12 on the second chip 500. The first chip 100 and the second chip 500 may have core circuits with different functions or structures, or may have core circuits with the same functions and structures. As illustrated in FIG. 13, unlike the pair of chips according to Embodiment 1 illustrated in FIG. 7, the top and bottom of the second chip 500 are flipped in the pair of chips according to Embodiment 2, so that the surface of the substrate 501 of the second chip faces the surface of the substrate 101 of the first chip 100. The remaining structure of the pair of chips according to Embodiment 2 is similar to the pair of chips according to Embodiment 1 illustrated in FIG. 7. Details on this similar structure can be found in the description of Embodiment 1.

As further illustrated in FIG. 13, the first microbump 171 and the second microbump 172 are formed on the surface of the substrate 101 of the first chip 100 in the gap between the first chip 100 and second chip 500. A third microbump 571 and a fourth microbump 572 are formed on the surface of the substrate 501 of the second chip 500. When the first chip 100 is placed on top of the second chip 500, the first TSV 131 and the third TSV 531 are connected by the first microbump 171 and the third microbump 571, whereas the second TSV 132 and the fourth TSV 532 are connected by the second microbump 172 and the fourth microbump 572. As a result, the test signal generation circuit and the test result judgment circuit implemented on the first chip 100 are connected to the test signal generation circuit and the test result judgment circuit implemented on the second chip 500 through the four TSVs 131, 132, 531, and 532 and the four microbumps 171, 172, 571, and 572. With the chips in this state, the second connection test is performed.

Figure 14A:
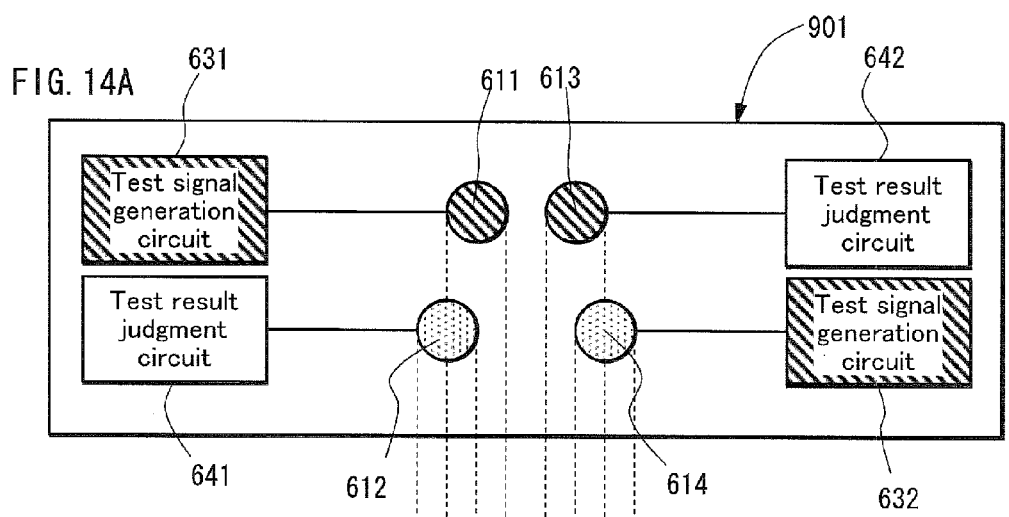
FIGS. 14A and 14B are schematic diagrams illustrating conditions during the second connection test with the chips 901 and 902 layered as illustrated in FIG. 13.
Figure 14B:
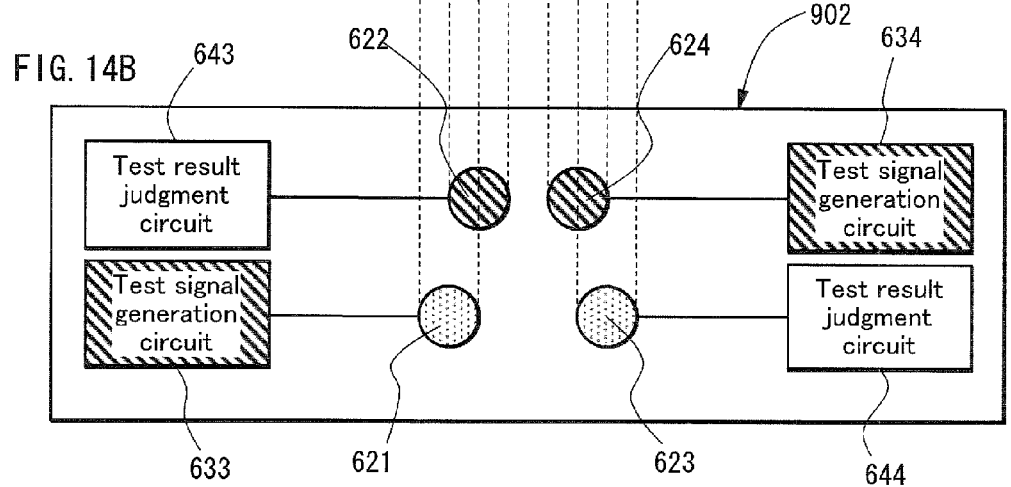

FIGS. 14A and 14B are schematic diagrams illustrating conditions when performing the second connection test on chips 901 and 902 layered as illustrated in FIG. 13. FIG. 14A is a block diagram of four TSVs and their surrounding circuits in the upper chip 901 (hereinafter referred to as the "first chip"), and FIG. 14B is a block diagram of four TSVs and their surrounding circuits in the lower chip 902 (hereinafter referred to as the "second chip"). The same as the four TSVs illustrated in FIG. 4, four TSVs 611-614 and 621-624 are adjacent to each other in the respective chips 901 and 902, and are connected by different interconnections. Furthermore, between the first chip 901 and the second chip 902, as illustrated in FIG. 13, four microbumps 171, 172, 571, and 572 are connected two by two to connect TSVs that are adjacent along a normal line between the chips 901 and 902. As a result, as indicated by the dashed lines in FIGS. 14A and 14B, the first TSV 611 and the sixth TSV 622 are connected, the second TSV 612 and the fifth TSV 621 are connected, the third TSV 613 and the eighth TSV 624 are connected, and the fourth TSV 614 and the seventh TSV 623 are connected.

The first chip 901 includes the first test signal generation circuit 631, the second test signal generation circuit 632, the first test result judgment circuit 641, and the second test result judgment circuit 642. The second chip 902 includes the third test signal generation circuit 633, the fourth test signal generation circuit 634, the third test result judgment circuit 643, and the fourth test result judgment circuit 644. The test signal generation circuits 631-634 are instructed by an external device through a JTAG interface, to begin generating a test signal. The test signal generation circuits 631-634 generate a test signal in response to the instruction and output the test signal to the TSVs 611, 614, 621, and 624 connected to the test signal generation circuits 631-634. The test result judgment circuits 641-644 store patterns of test signals in advance. The test result judgment circuits 641-644 are instructed by an external device through the JTAG interface, or by the test signal generation circuits 631-634, to begin judging the pattern of the test signal. In response to the instruction, the test result judgment circuits 641-644 receive the signal from the TSVs 612, 613, 622, and 623 connected to the test result judgment circuits 641-644 and judge whether the pattern of the signal matches the pattern of the test signal.

While not illustrated in FIGS. 14A and 14B, core circuits with a variety of functions are implemented on the chips 901 and 902. The TSVs 611-614 and 621-624 are connected to the respective core circuits. The chips 901 and 902 may also include test circuits such as BIST circuits.

The test signal output by the first test signal generation circuit 631 passes through the first TSV 611 and the sixth TSV 622, and then the test signal is received by the third test result judgment circuit 643. The third test result judgment circuit 643 compares the pattern of the received signal with the pattern of the test signal. Based on the comparison results, it is possible to determine whether a connection fault has occurred between the first TSV 611 and the sixth TSV 622 due to misalignment of a TSV, a junction fault at a microbump, or another such reason.

The test signal output by the second test signal generation circuit 632 passes through the fourth TSV 614 and the seventh TSV 623, and then the test signal is received by the fourth test result judgment circuit 644. The fourth test result judgment circuit 644 compares the pattern of the received signal with the pattern of the test signal. Based on the comparison results, it is possible to determine whether a connection fault has occurred between the fourth TSV 614 and the seventh TSV 623 due to misalignment of a TSV, a junction fault at a microbump, or another such reason.

The test signal output by the third test signal generation circuit 633 passes through the fifth TSV 621 and the second TSV 612, and then the test signal is received by the first test result judgment circuit 641. The first test result judgment circuit 641 compares the pattern of the received signal with the pattern of the test signal. Based on the comparison results, it is possible to determine whether a connection fault has occurred between the second TSV 612 and the fifth TSV 621 due to misalignment of a TSV, a junction fault at a microbump, or another such reason.

The test signal output by the fourth test signal generation circuit 634 passes through the eighth TSV 624 and the third TSV 613, and then the test signal is received by the second test result judgment circuit 642. The second test result judgment circuit 642 compares the pattern of the received signal with the pattern of the test signal. Based on the comparison results, it is possible to determine whether a connection fault has occurred between the third TSV 613 and the eighth TSV 624 due to misalignment of a TSV, a junction fault at a microbump, or another such reason.

As has been described, in the three-dimensional integrated circuit according to Embodiment 2 of the present invention, each chip is provided with a pair of a test signal generation circuit and a test result judgment circuit for each pair of TSVs. As a result, before layering a plurality of chips, it is possible to detect the conducting state of two adjacent TSVs by connecting the TSVs together with a testing wire. Furthermore, as illustrated in FIG. 11, the test signal generation circuits 22 and the test result judgment circuits 23 are placed in a zigzag lattice pattern, with the TSV region 12 therebetween. This pattern results in each test signal generation circuit 22 facing a test result judgment circuit 23 in another test circuit region, with the TSV region 12 therebetween. Accordingly, when layering two chips, the test result judgment circuit of one chip can receive the test signal output by the test signal generation circuit of the other chip by turning one of the chips upside down. It is therefore possible to detect the conducting state of the TSVs between the chips. In this way, both before and after layering a plurality of chips, the same test circuits can be used to test the TSVs that connect the plurality of chips. Using the same test circuits improves the efficiency of testing. Furthermore, unlike the chips according to Embodiment 1, the chips according to Embodiment 2 do not require a switch circuit, thereby reducing the area of the test circuit regions 13L and 13R.

Modifications (H) Right and left may be reversed in the circuit layout of the test circuit regions 13L and 13R illustrated in FIG. 11. Furthermore, in FIG. 12, the sets of a test signal generation circuit and a test result judgment circuit (211, 221) and (212, 222) located in the test circuit regions 13L and 13R are respectively connected to two vertically adjacent TSVs (201, 202) and (203, 204). The sets of a test signal generation circuit and a test result judgment circuit (211, 221) and (212, 222) may instead be respectively connected to two horizontally adjacent TSVs (201, 203) and (202, 204).

(I) In FIG. 13, the two microbumps 171 and 172 formed on the surface of the substrate 101 of the first chip 100 are connected to the two microbumps 571 and 572 formed on the surface of the substrate 501 of the second chip 500. Alternatively, microbumps may be formed on the surface of the substrate of only one of the first chip 100 and the second chip 500, and the microbumps may then be connected directly to the TSVs of the other chip.

Embodiment 3

Chips according to Embodiment 3 of the present invention differ from chips according to Embodiment 1 in that TSVs in the TSV region are placed in three rows. Other elements of the chips according to Embodiment 3 are similar to those of the chips according to Embodiment 1. Details on similar elements can be found in the description of Embodiment 1.

Figure 15:
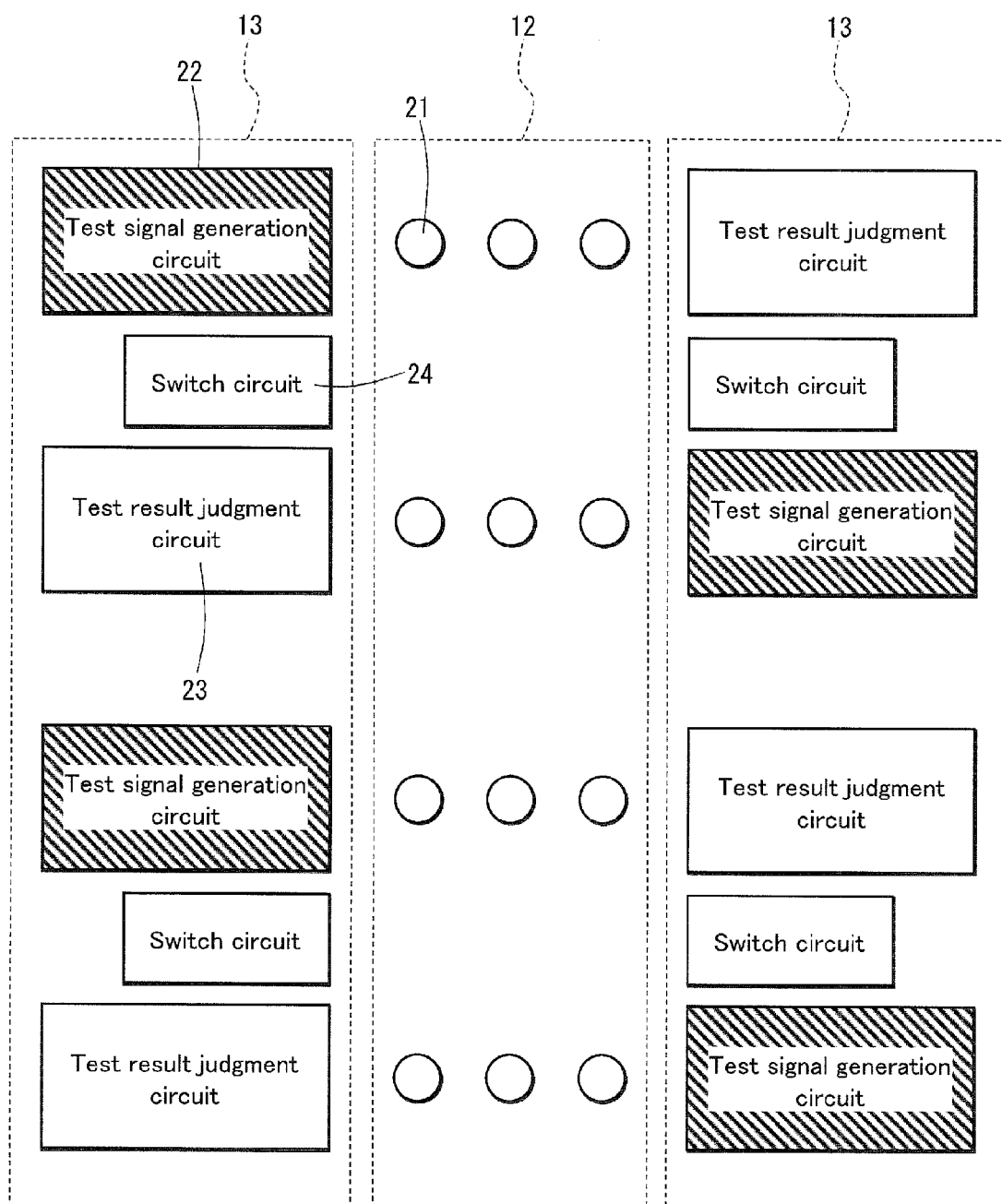
FIG. 15 is a schematic diagram illustrating the planar structure of the TSV region 12 and the test circuit regions 13 in the chips according to Embodiment 3 of the present invention.

FIG. 15 is a schematic diagram illustrating the planar structure of the TSV region 12 and the test circuit regions 13 in the chips according to Embodiment 3. As illustrated in FIG. 15, a plurality of TSVs 21 is placed in three rows in the TSV region 12. The diameter of each TSV 21 is several micrometers. The interval between each TSV 21 is several dozen micrometers. In each of the test circuit regions 13, sets of a test signal generation circuit 22, a test result judgment circuit 23 and a switch circuit 24 are located adjacent to a pair of TSVs 21.

Figure 16:
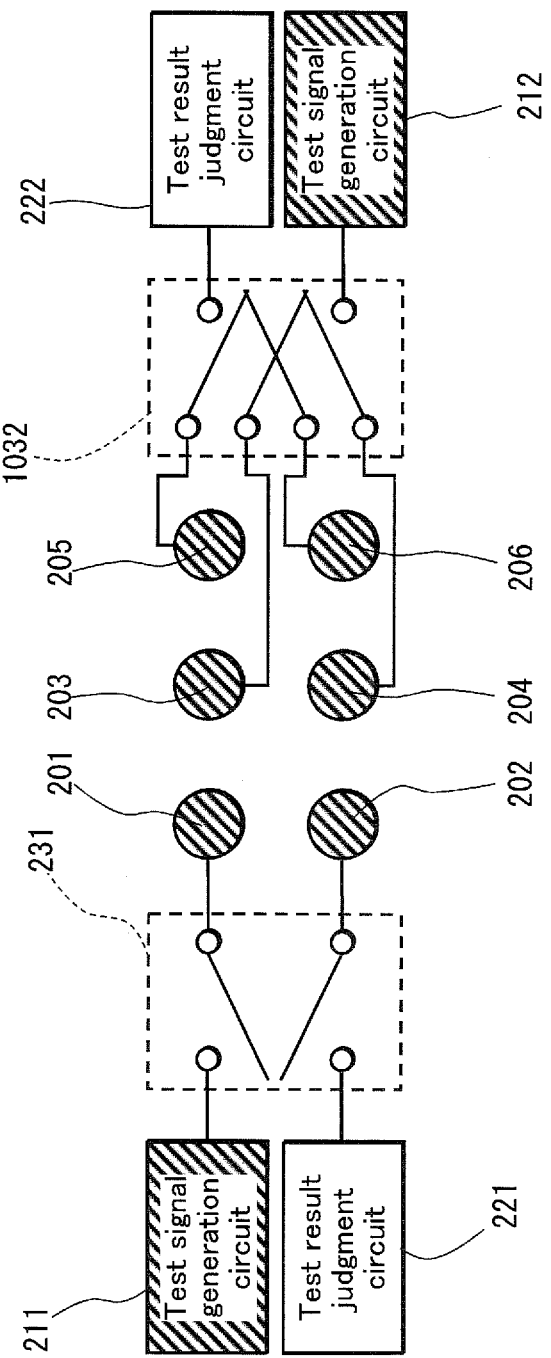
FIG. 16 is a block diagram of six adjacent TSVs 201-206 in the TSV region 12 and of their surrounding circuits illustrated in FIG. 15.

FIG. 16 is a block diagram of six adjacent TSVs 201-206 in the TSV region 12 and of their surrounding circuits. As illustrated in FIG. 16, the surrounding circuits include the first test signal generation circuit 211, the second test signal generation circuit 212, the first test result judgment circuit 221, the second test result judgment circuit 222, the first switch circuit 231, and a second switch circuit 1032. The test signal generation circuits 211 and 212 are instructed by an external device through a JTAG interface, to begin generating a test signal. The first test signal generation circuit 211 generates a test signal in response to the instruction and outputs the test signal to the first switch circuit 231. The second test signal generation circuit 212 generates a test signal in response to the instruction and outputs the test signal to the second switch circuit 1032. The test result judgment circuits 221 and 222 are instructed by an external device through the JTAG interface, or by the test signal generation circuits 211 and 212, to begin judging the pattern of the test signal. In response to the instruction, the first test result judgment circuit 221 receives the signal from the first switch circuit 231 and judges whether the pattern of the signal matches the pattern of the test signal. In response to the above instruction, the second test result judgment circuit 222 receives the signal from the second switch circuit 1032 and judges whether the pattern of the signal matches the pattern of the test signal. Information on the results of judgment is transmitted from each of the test result judgment circuits 221 and 222 to an external device through the JTAG interface. The first switch circuit 231 connects each of the first test signal generation circuit 211 and the first test result judgment circuit 221 to either one of the first TSV 201 and the second TSV 202. The second switch circuit 1032 connects each of the second test signal generation circuit 212 and the second test result judgment circuit 222 to either one of the third TSV 203, the fourth TSV 204, a fifth TSV 205, and a sixth TSV 206. The switch circuits 231 and 1032 select the destination in response to an instruction received from an external device through the JTAG interface.

First Connection Test

Figures 17A, 17B, 17C:
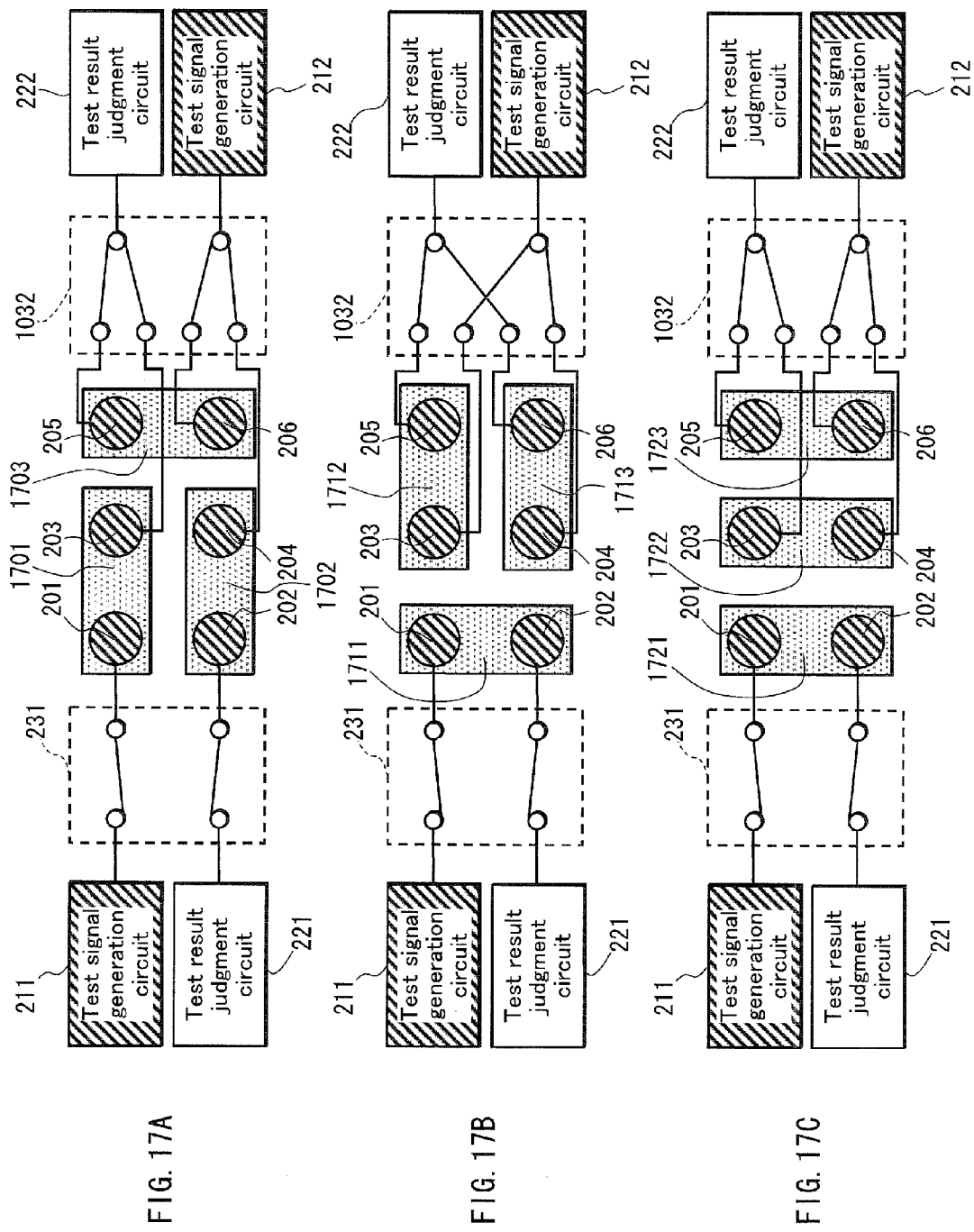
FIGS. 17A, 17B, and 17C are schematic diagrams illustrating conditions when performing the first connection test on the six TSVs 201-206 illustrated in FIG. 16, respectively illustrating connection of the six TSVs in a first pattern, a second pattern, and a third pattern.

FIGS. 17A, 17B, and 17C are schematic diagrams illustrating conditions when performing the first connection test on the six TSVs 201-206 illustrated in FIG. 16. During the first connection test, as illustrated in FIG. 5, a test support substrate is mounted onto the chip. As a result, as illustrated in FIGS. 17A, 17B, and 17C, among the six TSVs 201-206, each pair of either vertically or horizontally adjacent TSVs is connected by the testing wire. There are three patterns for connection.

FIG. 17A is a schematic diagram illustrating conditions when the six TSVs are connected in the first pattern. As shown in FIG. 17A, the first TSV 201 and the third TSV 203 are connected by a first testing wire 1701, the second TSV 202 and the fourth TSV 204 are connected by a second testing wire 1702, and the fifth TSV 205 and the sixth TSV 206 are connected by a third testing wire 1703. In this case, the first switch circuit 231 connects the first test signal generation circuit 211 with the first TSV 201 and connects the first test result judgment circuit 221 with the second TSV 202. When the first connection test is performed on the pair of the first TSV 201 and the third TSV 203, the second switch circuit 1032 connects the second test result judgment circuit 222 to the third TSV 203. When the first connection test is performed on the pair of the second TSV 202 and the fourth TSV 204, the second switch circuit 1032 connects the second test signal generation circuit 212 to the fourth TSV 204. When the first connection test is performed on the pair of the fifth TSV 205 and the sixth TSV 206, the second switch circuit 1032 connects the second test signal generation circuit 212 to the sixth TSV 206 and connects the second test result judgment circuit 222 to the fifth TSV 205. Based on the operations of the two switch circuits 231 and 1032, the test signal output from the first test signal generation circuit 211 passes through the first switch circuit 231, the first TSV 201, the first testing wire 1701, the third TSV 203, and the second switch circuit 1032, and then the test signal is received by the second test result judgment circuit 222. The second test result judgment circuit 222 compares the pattern of the received signal with the pattern of the test signal. Based on the comparison results, it is possible to determine whether a connection fault due to a void has occurred in either the first TSV 201 or the third TSV 203. On the other hand, when the first connection test is performed on the pair of the second TSV 202 and the fourth TSV 204, the test signal output by the second test signal generation circuit 212 passes through the second switch circuit 1032, the fourth TSV 204, the second testing wire 1702, the second TSV 202, and the first switch circuit 231, and then the test signal is received by the first test result judgment circuit 221. The first test result judgment circuit 221 compares the pattern of the received signal with the pattern of the test signal. Based on the comparison results, it is possible to determine whether a connection fault due to a void has occurred in either the second TSV 202 or the fourth TSV 204. When the first connection test is performed on the pair of the fifth TSV 205 and the sixth TSV 206, the test signal output from the second test signal generation circuit 212 passes through the second switch circuit 1032, the fifth TSV 205, the third testing wire 1703, the sixth TSV 206, and the second switch circuit 1032, and then the test signal is received by the second test result judgment circuit 222. The second test result judgment circuit 222 compares the pattern of the received signal with the pattern of the test signal. Based on the comparison results, it is possible to determine whether a connection fault due to a void has occurred in either the fifth TSV 205 or the sixth TSV 206.

FIG. 17B is a schematic diagram illustrating conditions when the six TSVs are connected in the second pattern. As shown in FIG. 17B, the first TSV 201 and the second TSV 202 are connected by a first testing wire 1711, the third TSV 203 and the fifth TSV 205 are connected by a second testing wire 1712, and the fourth TSV 204 and the sixth TSV 206 are connected by a third testing wire 1713. In this case, the first switch circuit 231 connects the first test signal generation circuit 211 with the first TSV 201 and connects the first test result judgment circuit 221 with the second TSV 202. When the first connection test is performed on the pair of the third TSV 203 and the fifth TSV 205, the second switch circuit 1032 connects the second test signal generation circuit 212 to the third TSV 203 and connects the second test result judgment circuit 222 to the fifth TSV 205. When the first connection test is performed on the pair of the fourth TSV 204 and the sixth TSV 206, the second switch circuit 1032 connects the second test signal generation circuit 212 to the fourth TSV 204 and connects the second test result judgment circuit 222 to the sixth TSV 206. Based on the operations of the first switch circuit 231, the test signal output from the first test signal generation circuit 211 passes through the first switch circuit 231, the first TSV 201, the first testing wire 1711, the second TSV 202, and the first switch circuit 231, and then the test signal is received by the first test result judgment circuit 221. The first test result judgment circuit 221 compares the pattern of the received signal with the pattern of the test signal. Based on the comparison results, it is possible to determine whether a connection fault due to a void has occurred in either the first TSV 201 or the second TSV 202. On the other hand, when the first connection test is performed on the pair of the third TSV 203 and the fifth TSV 205, the test signal output by the second test signal generation circuit 212 passes through the second switch circuit 1032, the third TSV 203, the second testing wire 1712, the fifth TSV 205, and the second switch circuit 1032, based on the operations of the second switch circuit 1032, and then the test signal is received by the second test result judgment circuit 222. The second test result judgment circuit 222 compares the pattern of the received signal with the pattern of the test signal. Based on the comparison results, it is possible to determine whether a connection fault due to a void has occurred in either the third TSV 203 or the fifth TSV 205. When the first connection test is performed on the pair of the fourth TSV 204 and the sixth TSV 206, the test signal output by the second test signal generation circuit 212 passes through the second switch circuit 1032, the fourth TSV 204, the third testing wire 1713, the sixth TSV 206, and the second switch circuit 1032, and then the test signal is received by the second test result judgment circuit 222. The second test result judgment circuit 222 compares the pattern of the received signal with the pattern of the test signal. Based on the comparison results, it is possible to determine whether a connection fault due to a void has occurred in either the fourth TSV 204 or the sixth TSV 206.

FIG. 17C is a schematic diagram illustrating conditions when the six TSVs are connected in the third pattern. As shown in FIG. 17C, the first TSV 201 and the second TSV 202 are connected by a first testing wire 1721, the third TSV 203 and the fourth TSV 204 are connected by a second testing wire 1722, and the fifth TSV 205 and the sixth TSV 206 are connected by a third testing wire 1723. In this case, the first switch circuit 231 connects the first test signal generation circuit 211 with the first TSV 201, and connects the first test result judgment circuit 221 with the second TSV 202. When the first connection test is performed on the pair of the third TSV 203 and the fourth TSV 204, the second switch circuit 1032 connects the second test signal generation circuit 212 to the fourth TSV 204 and connects the second test result judgment circuit 222 to the third TSV 203. When the first connection test is performed on the pair of the fifth TSV 205 and the sixth TSV 206, the second switch circuit 1032 connects the second test signal generation circuit 212 to the sixth TSV 206, and connects the second test result judgment circuit 222 to the fifth TSV 205. Based on the operations of the switch circuit 231, the test signal output from the first test signal generation circuit 211 passes through the first switch circuit 231, the first TSV 201, the first testing wire 1721, the second TSV 202, and the first switch circuit 231, and then the test signal is received by the first test result judgment circuit 221. The first test result judgment circuit 221 compares the pattern of the received signal with the pattern of the test signal. Based on the comparison results, it is possible to determine whether a connection fault due to a void has occurred in either the first TSV 201 or the second TSV 202. On the other hand, when the first connection test is performed on the pair of the third TSV 203 and the fourth TSV 204, the test signal output by the second test signal generation circuit 212 passes through the second switch circuit 1032, the fourth TSV 204, the second testing wire 1722, the third TSV 203, and the second switch circuit 1032, based on the operations of the second switch circuit 1032, and then the test signal is received by the second test result judgment circuit 222. The second test result judgment circuit 222 compares the pattern of the received signal with the pattern of the test signal. Based on the comparison results, it is possible to determine whether a connection fault due to a void has occurred in either the third TSV 203 or the fourth TSV 204. When the first connection test is performed on the pair of the fifth TSV 205 and the sixth TSV 206, the test signal output from the second test signal generation circuit 212 passes through the second switch circuit 1032, the sixth TSV 206, the third testing wire 1723, the fifth TSV 205, and the second switch circuit 1032, and then the test signal is received by the second test result judgment circuit 222. The second test result judgment circuit 222 compares the pattern of the received signal with the pattern of the test signal. Based on the comparison results, it is possible to determine whether a connection fault due to a void has occurred in either the fifth TSV 205 or the sixth TSV 206.

Second Connection Test

Two chips according to Embodiment 3 are layered similarly to the two chips 100 and 500 according to Embodiment 1, as illustrated in FIG. 7. In particular, between the upper chip (hereinafter referred to as the "first chip") and the lower chip (hereinafter referred to as the "second chip"), each pair of TSVs that are adjacent along a normal line between the chips is connected by microbumps and by traces in the second chip.

As illustrated in FIG. 16, in both the first chip and the second chip, six TSVs 201-206 are adjacent to each other. Around these TSVs are located two test signal generation circuits 211 and 212, two test result judgment circuits 221 and 222, and two switch circuits 231 and 1032. The test signal generation circuits 211 and 212 are instructed by an external device through a JTAG interface, to begin generating a test signal. The test signal generation circuits 211 and 212 generate a test signal in response to the instruction and each output the test signal to one of the switch circuits 231 and 1032. The test result judgment circuits 221 and 222 store patterns of test signals in advance. The test result judgment circuits 221 and 222 are instructed by an external device through the JTAG interface, or by the test signal generation circuits 211 and 212, to begin judging the pattern of the test signal. In response to the instruction, the test result judgment circuits 221 and 222 each receive the signal from one of the switch circuits 231 and 1032 and judge whether the pattern of the signal matches the pattern of the test signal.

During the second connection test, the switch circuits 231 and 1032 on each chip operate as follows. In the first chip, the first switch circuit 231 connects the first test signal generation circuit 211 to the first TSV 201 and connects the first test result judgment circuit 221 to the second TSV 202. When the second connection test is performed on the third TSV 203 and the second chip 500, the second switch circuit 1032 connects the second test result judgment circuit 222 to the third TSV 203. When the second connection test is performed on the fourth TSV 204 and the second chip 500, the second switch circuit 1032 connects the second test signal generation circuit 212 to the fourth TSV 204. When the second connection test is performed on the fifth TSV 205 and the second chip 500, the second switch circuit 1032 connects the second test result judgment circuit 222 to the fifth TSV 205. When the second connection test is performed on the sixth TSV 206 and the second chip 500, the second switch circuit 1032 connects the second test signal generation circuit 212 to the sixth TSV 206. In the second chip, the first switch circuit 231 connects the first test signal generation circuit 211 to the second TSV 202 and connects the first test result judgment circuit 221 to the first TSV 201. When the second connection test is performed on the third TSV 203 and the second chip 500, the second switch circuit 1032 connects the second test signal generation circuit 212 to the third TSV 203. When the second connection test is performed on the fourth TSV 204 and the second chip 500, the second switch circuit 1032 connects the second test result judgment circuit 222 to the fourth TSV 204. When the second connection test is performed on the fifth TSV 205 and the second chip 500, the second switch circuit 1032 connects the second test signal generation circuit 212 to the fifth TSV 205. When the second connection test is performed on the sixth TSV 206 and the second chip 500, the second switch circuit 1032 connects the second test result judgment circuit 222 to the sixth TSV 206.

The test signal output from the first test signal generation circuit 211 in the first chip passes through the first switch circuit 231 and the first TSV 201 in the first chip and through the first switch circuit 231 in the second chip, and then the test signal is received by the first test result judgment circuit 221 in the second chip. The first test result judgment circuit 221 compares the pattern of the received signal with the pattern of the test signal. Based on the comparison results, it is possible to determine whether a connection fault has occurred between the second chip and the first TSV 201 in the first chip due to misalignment of a TSV, a junction fault at a microbump, or another such reason.

After passing through the second switch circuit 1032 in the first chip, the test signal output by the second test signal generation circuit 212 in the first chip is first sent to the fourth TSV 204 and then to the sixth TSV 206. After passing through the TSVs 204 and 206, the test signal passes through the second switch circuit 1032 in the second chip, and then the test signal is received by the second test result judgment circuit 222 in the second chip. The second test result judgment circuit 222 compares the pattern of the received signal with the pattern of the test signal. Based on the comparison results, it is possible to determine whether a connection fault has occurred between the second chip and the fourth TSV 204 in the first chip, or between the second chip and the sixth TSV 206 in the first chip, due to misalignment of a TSV, a junction fault at a microbump, or another such reason.

The test signal output from the first test signal generation circuit 211 in the second chip passes through the first switch circuit 231 in the second chip and the second TSV 202 and the first switch circuit 231 in the first chip, and then the test signal is received by the first test result judgment circuit 221 in the second chip. The first test result judgment circuit 221 compares the pattern of the received signal with the pattern of the test signal. Based on the comparison results, it is possible to determine whether a connection fault has occurred between the second chip and the second TSV 202 of the first chip due to misalignment of a TSV, a junction fault at a microbump, or another such reason.

After passing through the second switch circuit 1032 in the second chip, the test signal output by the second test signal generation circuit 212 in the second chip is first sent to the third TSV 203 in the first chip and then to the fifth TSV 205 in the first chip. After passing through the TSVs 203 and 205, the test signal passes through the second switch circuit 1032 in the first chip, and then the test signal is received by the second test result judgment circuit 222 in the first chip. The second test result judgment circuit 222 compares the pattern of the received signal with the pattern of the test signal. Based on the comparison results, it is possible to determine whether a connection fault has occurred between the second chip and the third TSV 203 in the first chip, or between the second chip and the fifth TSV 205 in the first chip, due to misalignment of a TSV, a junction fault at a microbump, or another such reason.

In the three-dimensional integrated circuit according to Embodiment 3 of the present invention, unlike the three-dimensional integrated circuit according to Embodiment 1, the TSVs 21 in the TSV region 12 are placed in three rows, as illustrated in FIG. 15. In this case, as illustrated in FIG. 16, the second switch circuit 1032 can connect a set of the test signal generation circuit 212 and the test result judgment circuit 222 to two pairs of TSVs (203, 205) and (204, 206). Compared to when the switch circuit can only connect a set of a test signal generation circuit and a test result judgment circuit to one pair of TSVs, the number of test signal generation circuits and test result judgment circuits is reduced, and thus the area of the test circuit region is reduced.

Like the switch circuit according to Embodiment 1, the switch circuit according to Embodiment 3 of the present invention connects one of two TSVs to a test signal generation circuit and connects the other to a test result judgment circuit. As a result, before layering a plurality of chips, it is possible to detect the conducting state of two TSVs in each of the chips by connecting the TSVs together. On the other hand, after layering the plurality of chips, the test signal generation circuit in one chip outputs a test signal, and the test result judgment circuit in another chip receives the test signal; this enables the conducting state of TSVs between the chips to be detected. In this way, both before and after layering a plurality of chips, the same test circuits can be used to test the TSVs that connect the plurality of chips. Using the same test circuits improves the efficiency of testing.

Modifications (J) In FIG. 16, one row of TSVs 201 and 202 is connected to the switch circuit 231 located in the test circuit region 13L on the left side of the TSV region 12, whereas two rows of TSVs 203-206 are connected to the switch circuit 1032 located in the test circuit region 13R on the right side of the TSV region 12. Conversely, one row of TSVs may be connected to the switch circuit located in the test circuit region 13R on the right side of the TSV region 12, and two rows of TSVs may be connected to the switch circuit provided in the test circuit region 13L on the left side. Furthermore, the layout shown in FIG. 16 and its mirror-reversed one may be combined with each other.

(K) In the layout shown in FIG. 16, the switch circuit 231 may be removed from the test circuit region 13L on the left side of the TSV region 12 as in the layout shown in FIG. 12. In this case, the second connection test is performed by turning the lower chip upside down, as illustrated in FIG. 13, and connecting the TSVs at the left edge of the TSV region 12 in each chip.

Embodiment 4

Chips according to Embodiment 4 of the present invention differ from chips according to Embodiment 1 in that TSVs in the TSV region are placed in four rows. Other elements of the chips according to Embodiment 4 are similar to those of the chips according to Embodiment 1. Details on similar elements can be found in the description of Embodiment 1.

Figure 18:
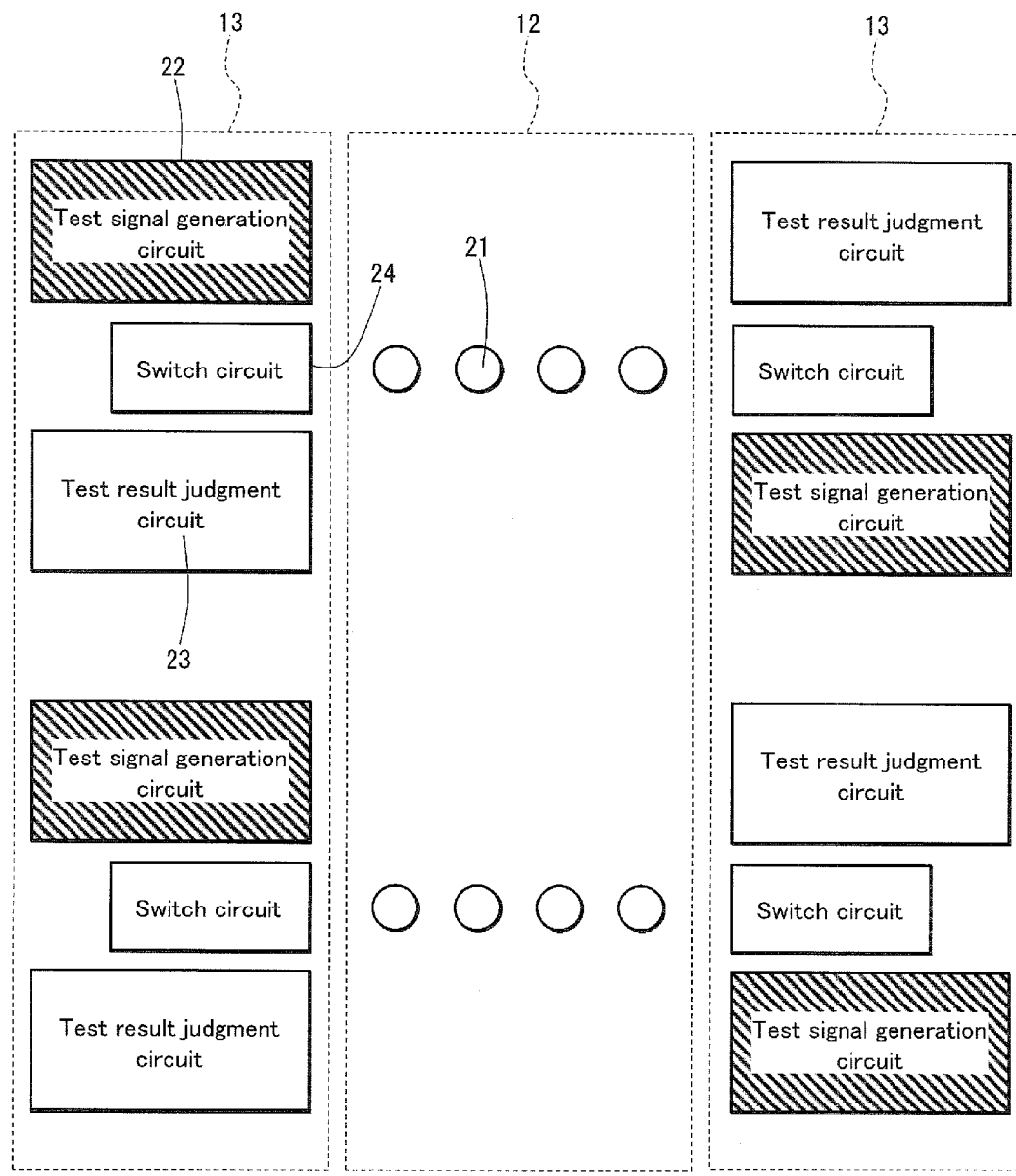
FIG. 18 is a schematic diagram illustrating the planar structure of the TSV region 12 and the test circuit regions 13 in the chips according to Embodiment 4 of the present invention.

FIG. 18 is a schematic diagram illustrating the planar structure of the TSV region 12 and the test circuit regions 14 in the chips according to Embodiment 4. As illustrated in FIG. 18, a plurality of TSVs 21 is placed in four rows in the TSV region 12. The diameter of each TSV 21 is several micrometers. The interval between each TSV 21 is several dozen micrometers. In each of the test circuit regions 13, sets of a test signal generation circuit 22, a test result judgment circuit 23 and a switch circuit 24 are located adjacent to a TSV 21.

Figure 19:
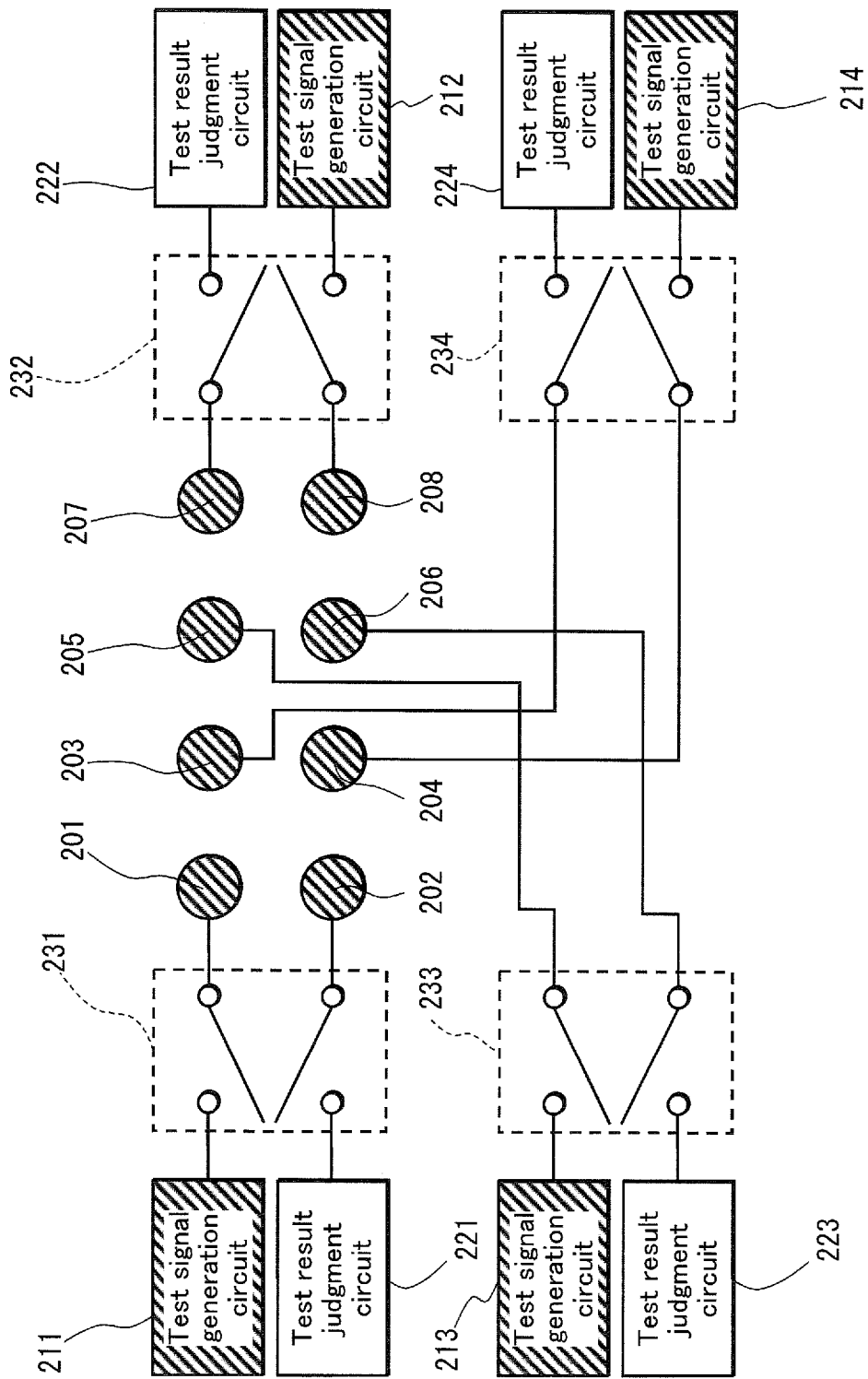
FIG. 19 is a block diagram of eight adjacent TSVs 201-208 in the TSV region 12 and of their surrounding circuits illustrated in FIG. 18.

FIG. 19 is a block diagram of eight adjacent TSVs 201-208 in the TSV region 12 and of their surrounding circuits. As illustrated in FIG. 19, the surrounding circuits include four test signal generation circuits 211, 212, 213, and 214, four test result judgment circuits 221, 222, 223, and 224, and four switch circuits 231, 232, 233, and 234. The first test signal generation circuit 211 and the first test result judgment circuit 221 are connected to the first switch circuit 231. The second test signal generation circuit 212 and the second test result judgment circuit 222 are connected to the second switch circuit 232. The third test signal generation circuit 213 and the third test result judgment circuit 223 are connected to the third switch circuit 233. The fourth test signal generation circuit 214 and the fourth test result judgment circuit 224 are connected to the fourth switch circuit 234. The test signal generation circuits 211-214 are instructed by an external device through a JTAG interface, to begin generating a test signal. The test signal generation circuits 211-214 generate a test signal in response to the instruction and output the test signal to the switch circuits 231-234 connected thereto. The test result judgment circuits 221-224 are instructed by an external device through the JTAG interface, or by the test signal generation circuits 211-214, to begin judging the pattern of the test signal. In response to the instruction, the test result judgment circuits 221-224 receive the signal from the switch circuits 231-234 connected thereto and judge whether the pattern of the signal matches the pattern of the test signal. Information on the results of judgment is transmitted from each of the test result judgment circuits 221-224 to an external device. The first switch circuit 231 is connected to the first TSV 201 and the second TSV 202. The second switch circuit 232 is connected to the seventh TSV 207 and the eighth TSV 208. The third switch circuit 233 is connected to the fifth TSV 205 and the sixth TSV 206. The fourth switch circuit 234 is connected to the third TSV 203 and the fourth TSV 204. Each of the switch circuits 231-234 connects a pair of a test signal generation circuit and a test result judgment circuit to a pair of TSVs. The switch circuits 231-234 select the connection destination in response to an instruction received from an external device through a JTAG interface.

First Connection Test

FIGS. 20A, 20B, 20C, 20D, and 20E are schematic diagrams illustrating conditions when performing the first connection test on the eight TSVs 201-208 illustrated in FIG. 19. During the first connection test, as illustrated in FIG. 5, a test support substrate is mounted onto the chip. As a result, as illustrated in FIGS. 20A, 20B, 20C, 20D, and 20E, among the eight TSVs 201-208, each pair of either vertically or horizontally adjacent TSVs is connected by a testing wire. As illustrated in FIGS. 20A, 20B, 20C, 20D, and 20E, there are five patterns for connection by testing wires. FIG. 20A shows the first pattern. In the first pattern, two horizontally adjacent TSVs are connected. FIG. 20B shows the second pattern. In the second pattern, among the eight TSVs, the four TSVs 201-204 in the left half are connected vertically, whereas the four TSVs 205-208 in the right half are connected horizontally. FIG. 20C shows the third pattern. In the third pattern, among the eight TSVs, the four TSVs 201-204 in the left half are connected horizontally, whereas the four TSVs 205-208 in the right half are connected vertically. FIG. 20D shows the fourth pattern. In the fourth pattern, two vertically adjacent TSVs are connected. FIG. 20E shows the fifth pattern. In the fifth pattern, the two TSVs 201 and 202 at the left edge are connected, the four TSVs 203-206 in the middle are connected horizontally, and the two TSVs 207 and 208 at the right edge are connected.

In the first pattern illustrated in FIG. 20A, the first TSV 201 and the third TSV 203 are connected by a first testing wire 2001; the second TSV 202 and the fourth TSV 204 are connected by a second testing wire 2002, the fifth TSV 205 and the seventh TSV 207 are connected by a third testing wire 2003, and the sixth TSV 206 and the eighth TSV 208 are connected by a fourth testing wire 2004. In this case, the first switch circuit 231 connects the first test signal generation circuit 211 with the first TSV 201 and connects the first test result judgment circuit 221 with the second TSV 202. The second switch circuit 232 connects the second test signal generation circuit 212 with the eighth TSV 208 and connects the second test result judgment circuit 222 with the seventh TSV 207. The third switch circuit 233 connects the third test signal generation circuit 213 with the fifth TSV 205 and connects the third test result judgment circuit 223 with the sixth TSV 206. The fourth switch circuit 234 connects the fourth test signal generation circuit 214 with the fourth TSV 204 and connects the fourth test result judgment circuit 224 with the third TSV 203. Based on the operations of the four switch circuits 231-234, the test signal output from the first test signal generation circuit 211 passes through the first switch circuit 231, the first TSV 201, the first testing wire 2001, the third TSV 203, and the fourth switch circuit 234, and then the test signal is received by the fourth test result judgment circuit 224. The fourth test result judgment circuit 224 compares the pattern of the received signal with the pattern of the test signal. Based on the comparison results, it is possible to determine whether a connection fault due to a void has occurred in either the first TSV 201 or the third TSV 203. The test signal output by the second test signal generation circuit 212 passes through the second switch circuit 232, the eighth TSV 208, the fourth testing wire 2004, the sixth TSV 206, and the third switch circuit 233, and then the test signal is received by the third test result judgment circuit 223. The third test result judgment circuit 223 compares the pattern of the received signal with the pattern of the test signal. Based on the comparison results, it is possible to determine whether a connection fault due to a void has occurred in either the sixth TSV 206 or the eighth TSV 208. The test signal output by the third test signal generation circuit 213 passes through the third switch circuit 233, the fifth TSV 205, the third testing wire 2003, the seventh TSV 207 and the second switch circuit 232, and then the test signal is received by the second test result judgment circuit 222. The second test result judgment circuit 222 compares the pattern of the received signal with the pattern of the test signal. Based on the comparison results, it is possible to determine whether a connection fault due to a void has occurred in either the fifth TSV 205 or the seventh TSV 207. The test signal output by the fourth test signal generation circuit 214 passes through the fourth switch circuit 234, fourth TSV 204, the second testing wire 2002, the second TSV 202, and the first switch circuit 231, and then the test signal is received by the first test result judgment circuit 221. The first test result judgment circuit 221 compares the pattern of the received signal with the pattern of the test signal. Based on the comparison results, it is possible to determine whether a connection fault due to a void has occurred in either the second TSV 202 or the fourth TSV 204.

When the testing wires connect the TSVs in a different pattern, the switch circuits 231-234 connect one of two adjacent TSVs to a test signal generation circuit and connect the other to a test result judgment circuit as well. As a result, two each of the eight TSVs are connected between a pair of a test signal generation circuit and a test result judgment circuit, and that allows for judgment of whether a connection fault due to a void has occurred in either of the TSVs.

Second Connection Test

Two chips according to Embodiment 4 are layered similarly to the two chips 100 and 500 according to Embodiment 1, as illustrated in FIG. 7. In particular, between the upper chip (hereinafter referred to as the "first chip") and the lower chip (hereinafter referred to as the "second chip"), each pair of TSVs that are adjacent along a normal line between the chips is connected by microbumps and by interconnections in the second chip.

As illustrated in FIG. 19, in both the first chip and the second chip, eight TSVs 201-208 are adjacent to each other. Around these TSVs are located four test signal generation circuits 211-214, four test result judgment circuits 221-224, and four switch circuits 231-234. The test signal generation circuits 211-214 are instructed by an external device through a JTAG interface, to begin generating a test signal. The test signal generation circuits 211-214 generate a test signal in response to the instruction and each output the test signal to one of the switch circuits 231-234. The test result judgment circuits 221-224 store patterns of test signals in advance. The test result judgment circuits 221-224 are instructed by an external device through the JTAG interface, or by the test signal generation circuits 211-214, to begin judging the pattern of the test signal. In response to the instruction, the test result judgment circuits 221-224 each receive the signal from one of the switch circuits 231-234 and judge whether the pattern of the signal matches the pattern of the test signal.

During the second connection test, the switch circuits 232-234 on each chip operate as follows. In the first chip, the first switch circuit 231 connects the first test signal generation circuit 211 to the first TSV 201 and connects the first test result judgment circuit 221 to the second TSV 202. The second switch circuit 232 connects the second test signal generation circuit 212 with the eighth TSV 208 and connects the second test result judgment circuit 222 with the seventh TSV 207. The third switch circuit 233 connects the third test signal generation circuit 213 with the fifth TSV 205 and connects the third test result judgment circuit 223 with the sixth TSV 206. The fourth switch circuit 234 connects the fourth test signal generation circuit 214 with the fourth TSV 204 and connects the fourth test result judgment circuit 224 with the third TSV 203. In the second chip, the first switch circuit 231 connects the first test signal generation circuit 211 to the second TSV 202 and connects the first test result judgment circuit 221 to the first TSV 201. The second switch circuit 232 connects the second test signal generation circuit 212 with the seventh TSV 207 and connects the second test result judgment circuit 222 with the eighth TSV 208. The third switch circuit 233 connects the third test signal generation circuit 213 with the sixth TSV 206 and connects the third test result judgment circuit 223 with the fifth TSV 205. The fourth switch circuit 234 connects the fourth test signal generation circuit 214 with the third TSV 203 and connects the fourth test result judgment circuit 224 with the fourth TSV 204.

The test signal output from the first test signal generation circuit 211 passes through the first switch circuit 231 and the first TSV 201 in the first chip and through the first switch circuit 231 in the second chip, and then the test signal is received by the first test result judgment circuit 221 in the second chip. The first test result judgment circuit 221 compares the pattern of the received signal with the pattern of the test signal. Based on the comparison results, it is possible to determine whether a connection fault has occurred between the second chip and the first TSV 201 of the first chip due to misalignment of a TSV, a junction fault at a microbump, or another such reason. Similarly, the test signals output by the test signal generation circuits 212-214 in the first chip pass through the eighth TSV 208, the fifth TSV 205, and the fourth TSV 204 in the first chip, respectively, and then the test signal is received by the test result judgment circuits 222-224 in the second chip. By comparing the pattern of the received signal with the pattern of the test signal, the test result judgment circuits 222-224 can determine whether a connection fault has occurred between the second chip and the TSVs 208, 205, and 204 in the first chip, respectively.

The test signal output from the first test signal generation circuit 211 in the second chip passes through the first switch circuit 231 in the second chip and the second TSV 202 and the first switch circuit 231 in the first chip, and then the test signal is received by the first test result judgment circuit 221 in the first chip. The first test result judgment circuit 221 compares the pattern of the received signal with the pattern of the test signal. Based on the comparison results, it is possible to determine whether a connection fault has occurred between the second chip and the second TSV 201 of the first chip due to misalignment of a TSV, a junction fault at a microbump, or another such reason. Similarly, the test signals output by the test signal generation circuits 212-214 in the second chip pass through the seventh TSV 207, the sixth TSV 206, and the third TSV 203 in the first chip, respectively, and then the test signal is received by the test result judgment circuits 222-224 in the first chip. By comparing the pattern of the received signal with the pattern of the test signal, the test result judgment circuits 222-224 can determine whether a connection fault has occurred between the second chip and the TSVs 207, 206, and 203 in the first chip, respectively.

In the three-dimensional integrated circuit according to Embodiment 4 of the present invention, unlike the three-dimensional integrated circuit according to Embodiment 1, the TSVs in the TSV region are placed in four rows. In this case as well, like the three-dimensional integrated circuit according to Embodiment 1, the switch circuit connects one of two TSVs to a test signal generation circuit and connects the other to a test result judgment circuit. As a result, before layering a plurality of chips, it is possible to detect the conducting state of two TSVs by connecting the TSVs together. On the other hand, after layering the plurality of chips, the test signal generation circuit in one chip outputs a test signal, and the test result judgment circuit in another chip receives the test signal; this enables the conducting state of TSVs between the chips to be detected. In this way, both before and after layering a plurality of chips, the same test circuits can be used to test the TSVs that connect the plurality of chips. Using the same test circuits improves the efficiency of testing.

Modifications (L) In FIG. 19, the switch circuits 231-234 are connected to two vertically adjacent TSVs (201, 202); (203, 204); and (205, 206), respectively. Alternatively, one or all of the switch circuits 231-234 may be connected to two horizontally adjacent TSVs.

(M) In the layout illustrated in FIG. 19, as in the layout illustrated in FIG. 12, the switch circuits may be removed from the test circuit region on one side or both sides of the TSV region 12. In this case, the second connection test is performed by turning the lower chip upside down, as illustrated in FIG. 13.

(N) TSVs may be placed in five rows or more in the TSV region by combining the layouts illustrated in FIGS. 4, 16, and 19. In this case as well, both before and after layering a plurality of chips, the same test circuits can be used to test the TSVs that connect the plurality of chips.

Supplementary Explanation

Based on the above embodiments, the present invention may also be characterized as follows.

A chip according to one aspect of the present invention is one among a plurality of chips layered into a three-dimensional integrated circuit and is provided with a pair of connections, a test signal generation circuit, and a test result judgment circuit. The pair of connections is electrically connected with an adjacent chip among the plurality of chips. The test signal generation circuit outputs a test signal to one of the connections. The test result judgment circuit receives the signal from the other one of the connections and, in accordance with the state of the signal, detects the conducting state of the transmission path for the signal.

In the chip according to this aspect of the present invention, as described above, one of the pair of connections provided in the chip is connected to the test signal generation circuit, and the other is connected to the test result judgment circuit. Therefore, before layering the chip on another chip, a series connection is formed by connecting the pair of connections with the conductor, and the conducting state of each of the connections is detected based on the conducting state of the series connection. After layering the chip on another chip, the test signal generation circuit in the chip outputs the test signal, and the test result judgment circuit in the other chip receives the test signal, and thus the conducting state of the connections between chips is tested. In this way, both before and after layering a plurality of chips, the conducting state of the connections between the plurality of chips can be tested efficiently.

The chip according to this aspect of the present invention may further be provided with a switch circuit. The switch circuit selects one of the connections, connects the selected connection to the test signal generation circuit, and connects the other connection to the test result judgment circuit. The layout of the test signal generation circuit and the test result judgment circuit can thus be freely designed.

The chip according to this aspect of the present invention may further be provided with a plurality of connections. Two adjacent connections among the plurality of connections constitute the above pair of connections. As a result, the wire length between the pair of connections and the test circuit region, as well as the testing wire length in the first connection test, can be reduced to the necessary minimum.

In the three-dimensional integrated circuit according to an aspect of the present invention, connections adjacent along a normal line between two adjacent chips among a plurality of chips may be electrically connected. This modification allows for simplification of the wiring structure in each chip.

In the test method for a three-dimensional integrated circuit according to an aspect of the present invention, the conductor may be an electrode formed on a test support substrate. In this case, when forming the series connection between the first connection and the second connection formed in the first chip, the electrode connects the first connection to the second connection by the first chip being placed on the test support substrate. In this way, the electrode formed on the test support substrate plays the role of the conductor, and therefore the first connection and the second connection can be reliably connected to each other In the test method for a three-dimensional integrated circuit according to an aspect of the present invention, when forming the series connection between the first connection and the second connection formed in the first chip, a first switch circuit formed in the first chip may connect one end of the series connection to the first test signal generation circuit and connect the other end of the series connection to the first test result judgment circuit. Furthermore, when the first chip is layered on the second chip, the first switch circuit may connect the first connection to the first test signal generation circuit and connect the second connection to the first test result judgment circuit, and a second switch circuit formed in the second chip may connect the first connection to the second test result judgment circuit and connect the second connection to the second test signal generation circuit. Since the switch circuit formed in each chip connects the connections to a test signal generation circuit or a test result judgment circuit, the layout of the test signal generation circuit and the test result judgment circuit can be freely designed.

A method of manufacturing a three-dimensional integrated circuit according to an aspect of the present invention is a method for manufacturing a three-dimensional integrated circuit in which a first chip is layered on a second chip. The method comprises the following steps. First, a core circuit, a first test signal generation circuit, a first test result judgment circuit, a first connection, and a second connection are formed in the first chip, and a core circuit, a second test signal generation circuit, and a second test result judgment circuit are formed in the second chip. Next, a series connection is formed by connecting the first connection and the second connection with a conductor, a first test signal is transmitted from the first test signal generation circuit to one end of the series connection, the first test signal is received from the other end of the series connection by the first test result judgment circuit, and a conducting state of the series connection is detected in accordance with a state of the first test signal. The first chip is then layered on the second chip, and the first chip is electrically connected to the second chip through the first connection and the second connection. Furthermore, a second test signal is transmitted from the second test signal generation circuit to the first connection, the second test signal is received from the first connection by the first test result judgment circuit, and the conducting state between the first connection and the second chip is detected in accordance with the state of the second test signal. A third test signal is then transmitted from the first test signal generation circuit to the second connection, the third test signal is received from the second connection by the second test result judgment circuit, and the conducting state between the second connection and the second chip is detected in accordance with the state of the third test signal.

As described above, in the method of manufacturing a three-dimensional integrated circuit according to an aspect of the present invention, before layering the two chips, a series connection is formed by connecting the pair of connections with the conductor, and the conducting state of each of the connections is detected based on the conducting state of the series connection. After layering the two chips, the test signal generation circuit in one chip outputs a test signal, and the test result judgment circuit in the other chip receives the test signal, and thus the conducting state of the connections between the chips is tested. In this way, both before and after layering the two chips, the conducting state of the connections between the chips can be tested efficiently.

INDUSTRIAL APPLICABILITY

The present invention relates to a manufacturing method of three-dimensional integrated circuits and, both before and after layering a plurality of chips, performs connection tests on the terminals connecting the chips using the same test circuits. The present invention therefore clearly has industrial applicability.

REFERENCE SIGNS LIST

- 12 TSV region of chip
- 13 test circuit region of chip
- 14 JTAG interface
- 201 first TSV
- 202 second TSV
- 203 third TSV
- 204 fourth TSV
- 211 first test signal generation circuit
- 212 second test signal generation circuit
- 221 first test result judgment circuit
- 222 second test result judgment circuit
- 231 first switch circuit
- 232 second switch circuit

The invention claimed is:

1. A test method for a three-dimensional integrated circuit in which a first chip is layered on a second chip, comprising the steps of:
   forming a series connection between a first connection and a second connection, formed in the first chip, by connecting the first connection and the second connection with a conductor;
   transmitting a first test signal from a first test signal generation circuit formed in the first chip to one end of the series connection, receiving the first test signal from the other end of the series connection with a first test result judgment circuit formed in the first chip, and detecting a conducting state of the series connection in accordance with a state of the first test signal;
   removing the conductor from the series connection, layering the first chip on the second chip, and electrically connecting the first chip to the second chip through the first connection and the second connection;
   transmitting a second test signal from the first test signal generation circuit to the first connection, receiving the second test signal from the first connection with a second test result judgment circuit formed in the second chip, and detecting a conducting state between the first connection and the second chip in accordance with a state of the second test signal; and
   transmitting a third test signal from a second test signal generation circuit formed in the second chip to the second connection, receiving the third test signal from the second connection with the first test result judgment circuit, and detecting a conducting state between the second connection and the second chip in accordance with a state of the third test signal.

2. The test method for the three-dimensional integrated circuit of claim 1, wherein
   the conductor is an electrode formed on a test support substrate, and the first connection is connected to the second connection through the electrode by placing the first chip on the test support substrate when forming the series connection.

3. The test method for the three-dimensional integrated circuit of claim 1, wherein
   when the series connection is formed, a first switch circuit formed in the first chip connects one end of the series connection to the first test signal generation circuit and connects the other end of the series connection to the first test result judgment circuit, and
   when the first chip is layered on the second chip, the first switch circuit connects the first connection to the first test signal generation circuit and connects the second connection to the first test result judgment circuit, and a second switch circuit formed in the second chip connects the first connection to the second test result judgment circuit and connects the second connection to the second test signal generation circuit.

4. A method of manufacturing a three-dimensional integrated circuit in which a first chip is layered on a second chip, comprising the steps of:
   forming a core circuit, a first test signal generation circuit, a first test result judgment circuit, a first connection, and a second connection in the first chip, and forming a core circuit, a second test signal generation circuit, and a second test result judgment circuit in the second chip;
   forming a series connection by connecting the first connection and the second connection with a conductor, transmitting a first test signal from the first test signal generation circuit to one end of the series connection, receiving the first test signal from the other end of the series connection with the first test result judgment circuit, and detecting a conducting state of the series connection in accordance with a state of the first test signal;
   layering the first chip on the second chip, and electrically connecting the first chip to the second chip through the first connection and the second connection;
   transmitting a second test signal from the second test signal generation circuit to the first connection, receiving the second test signal from the first connection with the first test result judgment circuit, and detecting a conducting state between the first connection and the second chip in accordance with a state of the second test signal; and
   transmitting a third test signal from the first test signal generation circuit to the second connection, receiving the third test signal from the second connection with the second test result judgment circuit, and detecting a conducting state between the second connection and the second chip in accordance with a state of the third test signal.

* * * * *